(12) United States Patent
Davis et al.

(10) Patent No.: US 12,500,198 B2
(45) Date of Patent: Dec. 16, 2025

(54) QUAD FLAT NO-LEAD (QFN) PACKAGE WITH TIE BARS AND DIRECT CONTACT INTERCONNECT BUILD-UP STRUCTURE AND METHOD FOR MAKING THE SAME

(71) Applicant: Deca Technologies USA, Inc., Tempe, AZ (US)

(72) Inventors: Robin Davis, Vancouver, WA (US); Paul R. Hoffman, San Diego, CA (US); Clifford Sandstrom, Richfield, MN (US); Timothy L. Olson, Phoenix, AZ (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 19/064,511

(22) Filed: Feb. 26, 2025

(65) Prior Publication Data

US 2025/0279382 A1 Sep. 4, 2025

Related U.S. Application Data

(60) Provisional application No. 63/560,525, filed on Mar. 1, 2024.

(51) Int. Cl.
*H01L 21/56* (2006.01)
*H01L 23/00* (2006.01)
*H01L 25/00* (2006.01)

(52) U.S. Cl.
CPC ............ *H01L 24/19* (2013.01); *H01L 21/561* (2013.01); *H01L 24/96* (2013.01); *H01L 25/50* (2013.01);
(Continued)

(58) Field of Classification Search
None
See application file for complete search history.

(56) References Cited

U.S. PATENT DOCUMENTS 5,570,274 A 10/1996 Saito
5,790,384 A 8/1998 Ahmad
(Continued)

FOREIGN PATENT DOCUMENTS

CN 104253105 12/2014
CN 212136437 U 12/2020
(Continued)

OTHER PUBLICATIONS

Anandan, Ramasamy et al. "Embedded Wafer Level BGA (EWLB)—Extra-Small and ELGA Packages." Electronics Packaging Technology Conference (EPTC), 2011. pp. 412-416.
(Continued)

*Primary Examiner* — Jay C Chang
(74) *Attorney, Agent, or Firm* — Booth Udall, PLC; Kenneth C. Booth

(57) ABSTRACT

A method of making a QFN, DEN, or SON package may comprise forming an embedded chip panel comprising a plurality of semiconductor chips embedded in encapsulant and separated by saw streets. A conductive layer may be formed over the embedded chip panel, the conductive layer comprising bussing lines, contact pads, traces, and tie bars, wherein the bussing lines and tie bars extend into the saw streets. Vertical conductive elements may be disposed over and coupled with the conductive layer. An encapsulant layer may be disposed over the conductive layer and around the vertical conductive elements, wherein the vertical conductive elements comprise exposed ends and at least a portion of the tie bars is exposed from the encapsulant layer. Land pads, a conductive pad finish, or SMS may be electroplated over the vertical conductive elements by providing a current through the bussing lines and tie bars.

23 Claims, 19 Drawing Sheets

(52) U.S. Cl.
CPC .............. *H01L 2224/19* (2013.01); *H01L 2224/95136* (2013.01); *H01L 2224/96* (2013.01)

(56) References Cited

U.S. PATENT DOCUMENTS

| | | | |
|---|---|---|---|
| 6,121,065 | A | 9/2000 | Wong |
| 6,133,626 | A | 10/2000 | Hawke |
| 6,294,406 | B1 | 9/2001 | Bertin |
| 7,456,496 | B2 | 11/2008 | Hwee |
| 7,476,980 | B2 | 1/2009 | Rebibis |
| 7,569,422 | B2 | 8/2009 | Lin |
| 7,829,380 | B2 | 11/2010 | Irsigler |
| 8,018,036 | B2 | 9/2011 | Goh |
| 8,030,770 | B1 | 10/2011 | Juskey |
| 8,164,171 | B2 | 4/2012 | Lin |
| 8,487,435 | B2 | 7/2013 | Juskey |
| 8,503,186 | B2 | 8/2013 | Lin |
| 8,653,647 | B2 | 2/2014 | Masuda |
| 8,664,044 | B2 | 3/2014 | Jin |
| 8,804,360 | B2 | 8/2014 | Lin |
| 8,860,207 | B2 | 10/2014 | Jin |
| 9,196,509 | B2 | 11/2015 | Scanlan |
| 9,355,945 | B1 | 5/2016 | Ge |
| 9,368,438 | B2 | 6/2016 | Lin |
| 9,385,074 | B2 | 7/2016 | Pendse |
| 9,391,041 | B2 | 7/2016 | Lin |
| 9,553,000 | B2 | 1/2017 | Yu |
| 9,601,463 | B2 | 3/2017 | Yu |
| 9,613,931 | B2 | 4/2017 | Lin |
| 9,685,390 | B2 | 6/2017 | Hu |
| 9,704,735 | B2 | 7/2017 | Konchady |
| 9,793,231 | B2 | 10/2017 | Chen |
| 9,831,170 | B2 | 11/2017 | Scanlan |
| 10,056,351 | B2 | 8/2018 | Yu |
| 10,229,892 | B2 | 3/2019 | Appelt |
| 10,325,879 | B2 | 6/2019 | Yu |
| 10,373,902 | B2 | 8/2019 | Scanlan |
| 10,490,468 | B2 | 11/2019 | Tsai |
| 10,510,721 | B2 | 12/2019 | Bhagavat |
| 10,593,620 | B2 | 3/2020 | Agarwal |
| 10,770,416 | B2 | 9/2020 | Kim |
| 10,879,224 | B2 | 12/2020 | Chen |
| 10,886,263 | B2 | 1/2021 | Chen |
| 11,024,605 | B2 | 6/2021 | Chen |
| 11,056,453 | B2 | 7/2021 | Olson |
| 11,171,076 | B2 | 11/2021 | Yu |
| 11,211,360 | B2 | 12/2021 | Huang |
| 11,276,656 | B2 | 3/2022 | Chen |
| 11,502,062 | B2 | 11/2022 | Chen |
| 2003/0122246 | A1 | 7/2003 | Lin |
| 2007/0278701 | A1 | 12/2007 | Chang |
| 2008/0038874 | A1 | 2/2008 | Lin |
| 2009/0212428 | A1 | 8/2009 | Yang |
| 2010/0290191 | A1 | 11/2010 | Lin |
| 2011/0156239 | A1 | 6/2011 | Jin |
| 2011/0202896 | A1 | 8/2011 | Scanlan |
| 2011/0210442 | A1 | 9/2011 | Lim |
| 2011/0285007 | A1 | 11/2011 | Chi |
| 2012/0038061 | A1 | 2/2012 | Su |
| 2012/0153493 | A1 | 6/2012 | Lee |
| 2012/0228754 | A1 | 9/2012 | Liu |
| 2013/0075894 | A1 | 3/2013 | Gallegos |
| 2013/0075924 | A1 | 3/2013 | Lin |
| 2013/0168830 | A1 | 7/2013 | Uehling |
| 2014/0102772 | A1 | 4/2014 | Chen |
| 2014/0124937 | A1 | 5/2014 | Wu |
| 2014/0335658 | A1* | 11/2014 | Scanlan ............ H01L 24/96 438/113 |
| 2015/0249856 | A1* | 9/2015 | Pereira ............ H01L 25/0657 725/70 |
| 2015/0380386 | A1* | 12/2015 | Vincent ............ H01L 21/78 257/773 |
| 2016/0005705 | A1 | 1/2016 | Masumoto |
| 2016/0254229 | A1 | 9/2016 | Yu |
| 2017/0148755 | A1 | 5/2017 | Scanlan |
| 2018/0019221 | A1 | 1/2018 | Appelt |
| 2018/0082911 | A1 | 3/2018 | Bishop |
| 2018/0102311 | A1 | 4/2018 | Shih |
| 2018/0130761 | A1 | 5/2018 | Kim |
| 2018/0366423 | A1* | 12/2018 | Ong ............ H01L 23/49827 |
| 2019/0027450 | A1 | 1/2019 | Choi |
| 2019/0221520 | A1 | 7/2019 | Kim |
| 2019/0259718 | A1 | 8/2019 | Ju-Il |
| 2019/0304938 | A1 | 10/2019 | Hadizadeh |
| 2019/0326257 | A1 | 10/2019 | Agarwal |
| 2019/0333893 | A1 | 10/2019 | Yu |
| 2019/0341351 | A1 | 11/2019 | May |
| 2020/0029435 | A1 | 1/2020 | Baek |
| 2020/0043853 | A1 | 2/2020 | Kim |
| 2020/0058627 | A1 | 2/2020 | Chen |
| 2020/0194330 | A1 | 6/2020 | Ramanathan |
| 2020/0219815 | A1 | 7/2020 | Elsherbini |
| 2020/0266184 | A1 | 8/2020 | Pietambaram |
| 2020/0294923 | A1 | 9/2020 | Bhagavat |
| 2020/0328161 | A1 | 10/2020 | Lin |
| 2020/0350272 | A1 | 11/2020 | Hong |
| 2020/0402941 | A1 | 12/2020 | Olson |
| 2020/0403299 | A1 | 12/2020 | Gupta |
| 2020/0409859 | A1 | 12/2020 | Saleh |
| 2020/0411397 | A1 | 12/2020 | Han |
| 2020/0411443 | A1 | 12/2020 | Guo |
| 2021/0066263 | A1 | 3/2021 | Chen |
| 2021/0366854 | A1 | 11/2021 | Yu |
| 2021/0366877 | A1 | 11/2021 | Wu |
| 2022/0005760 | A1 | 1/2022 | Dadvand |
| 2022/0262742 | A1 | 8/2022 | Hou |
| 2022/0352106 | A1 | 11/2022 | Sandstrom |
| 2023/0163112 | A1 | 5/2023 | We |
| 2023/0275047 | A1 | 8/2023 | Chen |

FOREIGN PATENT DOCUMENTS

| | | |
|---|---|---|
| CN | 112234035 A | 1/2021 |
| JP | 2018032750 | 3/2018 |
| KR | 20150009668 | 1/2015 |
| KR | 1020160123959 | 10/2016 |
| TW | 1261901 B | 9/2006 |
| TW | 201413845 | 4/2014 |
| TW | 202205600 A | 2/2022 |
| TW | 202234636 A | 9/2022 |
| WO | 2020263952 | 12/2020 |

OTHER PUBLICATIONS

Boettcher, Lars et al. Next Generation System in a Package Manufacturing by Embedded Chip Technologies. Additional Conferences (Device Packaging, HiTEC, HiTEN, & CICMT). 2010.

Boettcher, Lars et al. "Embedding of Chips for System in Package Realization—Technology and Applications." 2008. pp. 383-386.

Braun, Tanja et al. "Fan-Out Wafer and Panel Level Packaging as Packaging Platform for Heterogeneous Integration." Micromachines. 2019. vol. 10, pp. 342.

Jin, Yonggang et al. "Development and Characterization of Next Generation EWLB Embedded Wafer Level BGA) Packaging." ECTC, 2012. pp. 1388-1393.

Jin, Yonggang et al. "Enhanced Fan-Out WLP for High Power Device Packaging." International Electronics Manufacturing Technology Conference (IEMT), 2012.

Kurita, Yoichiro et al. "Fan-Out WLP With Highly Flexible Design Capabilities." 3rd Electronic System-Integration Technology Conference (ESTC), Sep. 13-16, 2010.

Ma, Yiyi et al. "Thermal Cycling Reliability Assessment and Enhancement of Embedded Wafer Level LGA Packages for Power Applications." Electronic Packaging Technology Conference (EPTC), 2012. pp. 606-611.

Motohasi, N., et al. System in Wafer Level Package Technology with RDL first process, 2011 Electronic Components and Technology Conferencepp 59-64.

(56) References Cited

OTHER PUBLICATIONS

Stahr, Hannes et al. "Embedded Components on the Way to Industrialisation." 2011. https://ats.het/wp-content/uploads/2017/03/SMTA_Austin_TX_2011_ECP_Paper.pdf.

* cited by examiner

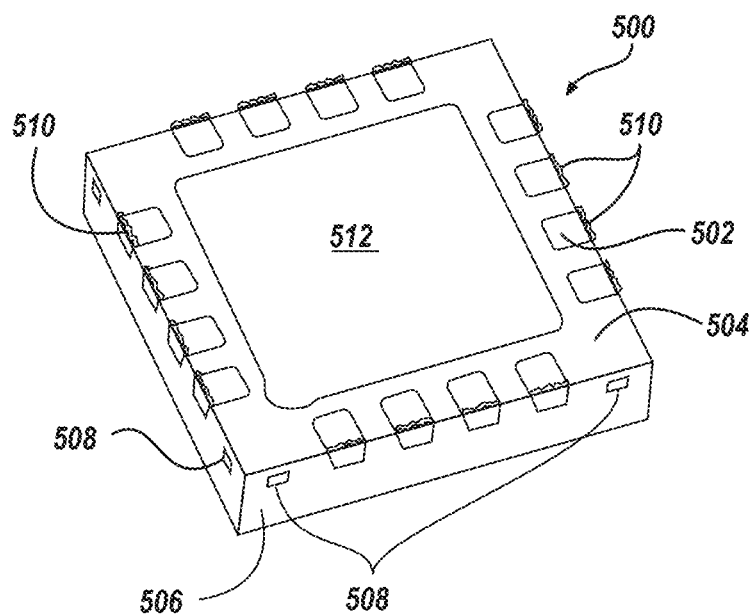
*FIG. 1A - Prior Art*
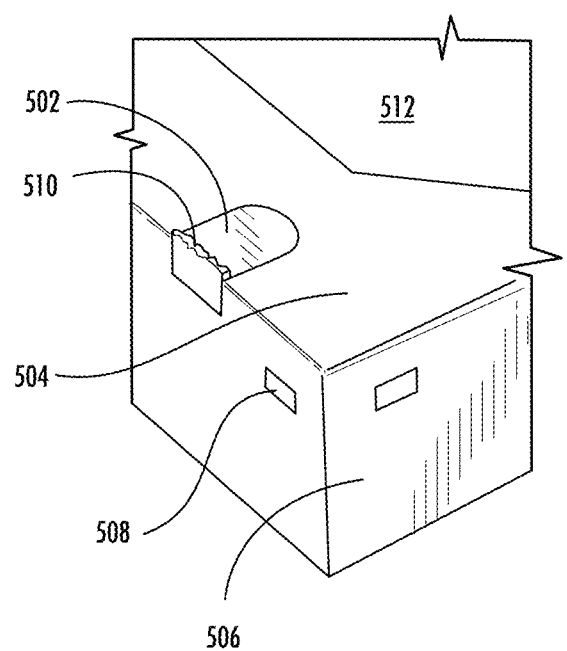
*FIG. 1B - Prior Art*

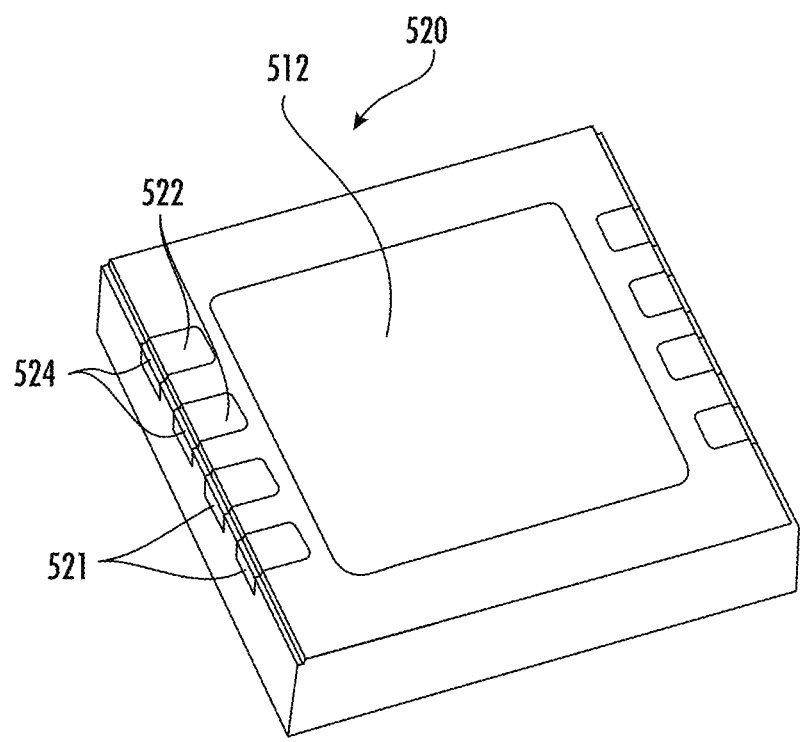
*FIG. 1C - Prior Art*
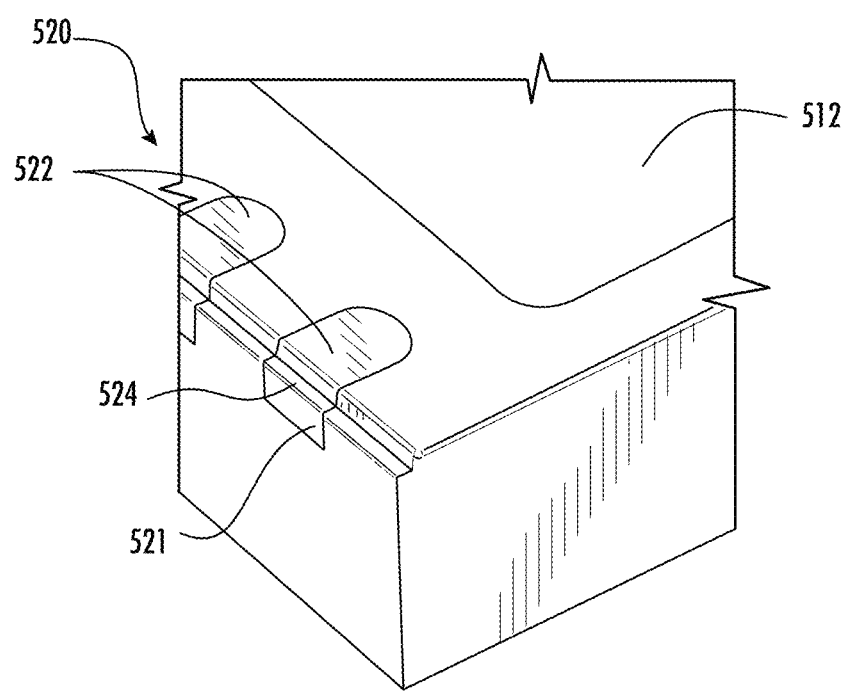
*FIG. 1D - Prior Art*

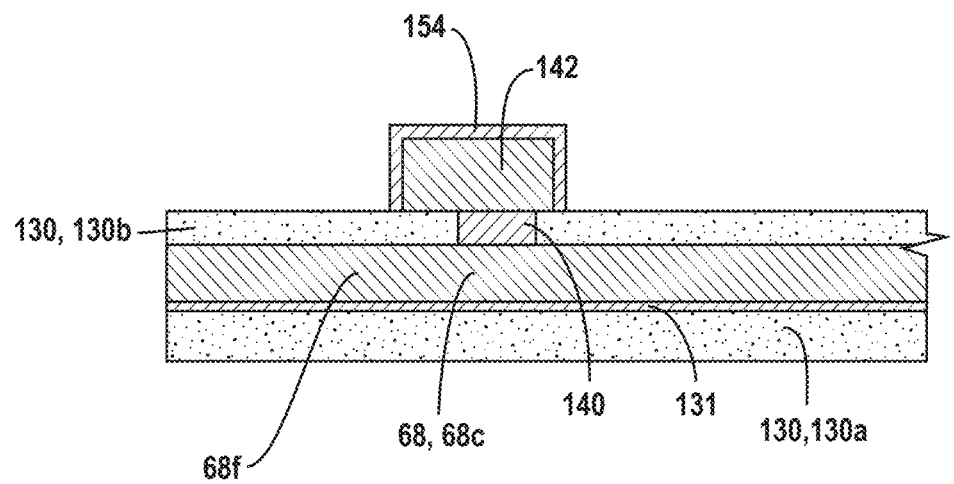
FIG. 4D₁
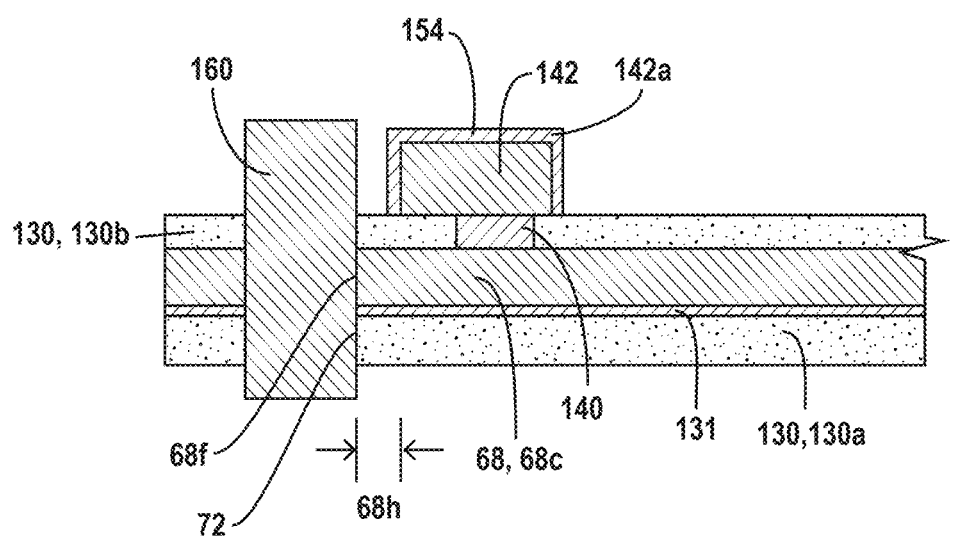
FIG. 4D₂

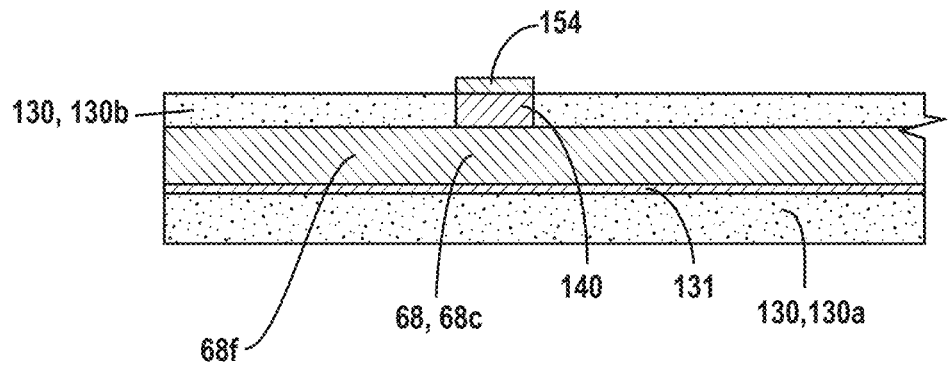
FIG. 4E₁
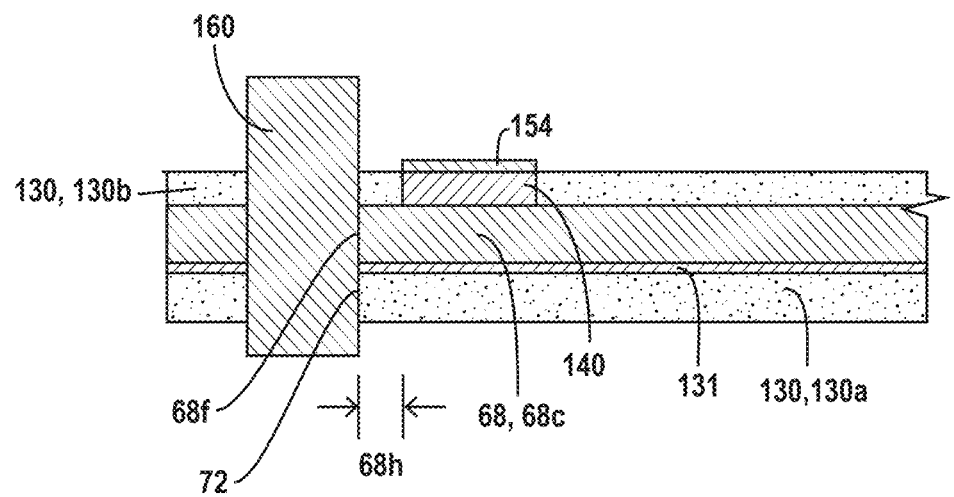
FIG. 4E₂

QUAD FLAT NO-LEAD (QFN) PACKAGE WITH TIE BARS AND DIRECT CONTACT INTERCONNECT BUILD-UP STRUCTURE AND METHOD FOR MAKING THE SAME

CROSS-REFERENCE TO RELATED APPLICATIONS

This application claims the benefit of U.S. Provisional Patent No. 63/560,525, entitled "Quad Flat No-Lead (QFN) Package with Tie Bars and Direct Contact Interconnect Build-Up Structure and Method for Making the Same," filed on Mar. 1, 2024, the entire disclosure of which is hereby incorporated herein by this reference.

INCORPORATION BY REFERENCE

This disclosure incorporates by reference the entirety of the disclosures of: (i) U.S. patent application Ser. No. 13/891,056 filed May 9, 2013 and entitled "Semiconductor Device and Method of land Grid Array Packaging with Bussing Lines, now U.S. Pat. No. 9,269,622, and (ii) U.S. patent application Ser. No. 17/957,683 filed Sep. 30, 2022 and entitled "Quat Flat No-lead (QFN) Package without Leadframe and Direct Contact Interconnect Build-up Structure and Method for Making the Same."

TECHNICAL FIELD

This disclosure concerns devices and methods of forming quad flat no-lead (QFN), dual flat no-lead (DFN) or small-outline no-lead (SON) semiconductor packaging with tie bars and with molded direct contact interconnect build-up structures.

BACKGROUND

Semiconductor devices, packages, substrates, and interposers are commonly found in modern electronic products. Production of semiconductor devices involves a multistep build-up of components. Conventional interconnect structures alternate dielectric and conductive layers. An opening or via is created in the dielectric to allow connectivity from one layer to another. On the conductive layers, capture pads are required for the vias to correct for inconsistencies in manufacture. Use of these conventional capture pads impacts the ability to construct compact structures due to limits on routing density. Additionally, traditional manufacturing processes involve the use of leadframes that result in exposed leadframe ends on the sides of the packaging.

SUMMARY

In some aspects, the disclosure relates to a method of making a QFN, DFN, SON package comprising forming an embedded chip panel comprising a plurality of semiconductor chips embedded in encapsulant and separated by saw streets. A conductive layer may be formed over the embedded chip panel, the conductive layer comprising: contact pads and traces formed over the plurality of semiconductor chips, the traces extending beyond an edge of the semiconductor chips and coupled with vertical conductive elements; bussing lines formed over the saw streets; and tie bars extending between and coupled with the contact pads and the bussing lines. Vertical conductive elements may be formed over and coupled with the conductive layer. An encapsulant layer may be disposed over the conductive layer and around the vertical conductive elements such that the vertical conductive elements comprise exposed ends, and wherein at least a portion of the tie bars comprise cut tie bar ends exposed from the encapsulant layer. Land pads, a conductive pad finish, or a SMS may be electroplated over the vertical conductive element by providing a current through the bussing lines and tie bars, wherein the land pads, conductive pad finish, or SMS are electroplated and protrude from the encapsulant layer. The embedded chip panel may be singulated through the saw streets to form a plurality of QFN, DFN, or SON packages with exposed ends of the tie bars exposed at a periphery of the QFN, DEN, or SON packages.

In an aspect of the disclosure the method may further comprise forming the embedded chip panel by disposing a plurality of semiconductor chips face-up on a temporary carrier, the plurality of semiconductor chips comprising the conductive studs disposed over active layers of the plurality of semiconductor chips; disposing encapsulant in a single step around four side surfaces of the plurality of semiconductor chips, over the active layers of the plurality of semiconductor chips, and around at least a portion of sidewalls of the conductive studs, wherein a portion of the encapsulant disposed between the plurality of semiconductor chips forms the saw street; and planarizing a surface of the encapsulant and conductive studs. The interior pads may be formed over the plurality of semiconductor chips. The cut tie bar ends may comprise a cross-sectional area in a range of 5-20 micrometers-squared. The land pads, conductive pad finish, or SMS may be electroplated to form a side surface. The QFN, DFN, or SON package may comprise a total height less than 300 micrometers, and may comprise one or more of: multiple independent interior pads; or land pads formed in single row, multiple rows, or as an area array. The conductive layer may be formed comprising reinforcement strips disposed around a periphery of the embedded chip panel. The QFN, DFN, or SON packages may be formed as a System-in-Packages (SiPs) or Multi-Chip-Modules (MCMs) comprising two or more chips in at least one of the QFN, DFN, or SON packages. At least a portion of the conductive layer may be formed using unit-specific patterning to account for actual positions of the plurality of semiconductor chips embedded within the embedded chip panel.

In another aspect the disclosure relates to a method of making a QFN, DFN, SON package, the method comprising forming an embedded chip panel comprising a plurality of semiconductor chips embedded in encapsulant and separated by saw streets. A conductive layer may be formed over the embedded chip panel, the conductive layer comprising bussing lines, contact pads, traces, and tie bars. The tie bars may extend between and be coupled with the contact pads and the bussing lines, and the bussing lines and tie bars may extend into the saw streets. Vertical conductive elements may be disposed over and coupled with the conductive layer. An encapsulant layer may be disposed over the conductive layer and around the vertical conductive elements such that the vertical conductive elements comprise exposed ends. At least a portion of the tie bars may be exposed from the encapsulant layer. Land pads, a conductive pad finish, or a SMS may be electroplated over the vertical conductive elements by providing a current through the bussing lines and tie bars.

In an aspect of the disclosure the method may further comprise electroplating a pad surface finish over the land pads to form a side surface for the land pads. The QFN, DFN, or SON package may comprise one or more of multiple independent interior pads, land pads formed in single row, multiple-rows, LGA, BGA, or as an area array for thermal, power, signal. The embedded chip panel may be singulated through the saw streets, removing a portion of the embedded chip panel to sever the tie bars, and singulating the strips into individual QFN, DFN, or SON packages. The QFN, DEN, or SON packages may be formed as SiPs or MCMs comprising two or more chips in at least one of the QFN, DFN, or SON packages. At least a portion of the conductive layer may be formed using unit-specific patterning to account for actual positions of the plurality of semiconductor chips embedded within the embedded chip panel.

In yet another aspect, the disclosure relates to a method of making a QFN, DEN, SON package, the method comprising forming an embedded chip panel comprising a plurality of semiconductor chips embedded in encapsulant and separated by saw streets. A conductive layer may be formed over the embedded chip panel and extend into the saw street. A vertical conductive element may be electroplated over the conductive layer by providing a current through the conductive layer. An encapsulant layer may be disposed over the conductive layer, wherein at least a portion of the conductive layer is exposed from the encapsulant layer. Land pads, a conductive pad finish, or a SMS may be electroplated over the vertical conductive element by providing a current through conductive layer.

In an aspect of the disclosure the method may further comprise an electroplated interior pad disposed over the embedded component. The embedded component may comprise conductive studs coupled to an active layer of the embedded component, and encapsulant may be disposed over the active layer of the embedded component and contact a side surface of the conductive studs. A pad surface finish may be formed over the land pads to form a side surface for the land pads that is not encapsulant defined. The QFN, DEN, or SON package may comprise one or more of multiple independent interior pads, land pads formed in single row, multiple-rows, LGA, BGA, or as an area array for thermal, power, signal. The QFN, DFN, or SON packages may be formed as SiPs or MCMs comprising two or more embedded components in the QFN, DEN, or SON packages. Unit-specific patterning may be used such that a misalignment between the embedded component and the conductive layer is less than a misalignment between the embedded component and a package edge.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that they can be their own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

BRIEF DESCRIPTION OF THE DRAWINGS

FIGS. 1A-1D show embodiments of conventional, prior art QFN, DEN and SON packages.

FIG. 4D$_1$ shows a cross-sectional side view of a portion of FIG. 4C, showing a land pad, LGA pad, or conductive pad with a pad finish or SMS disposed over the land pad.

FIG. 4D$_2$ illustrates the cross-sectional side view of FIG. 4D$_1$ during a sawing or singulation process.

FIG. 4E$_1$ shows a cross-sectional side view of a portion of FIG. 4C showing a vertical conductive element with a pad finish or SMS disposed over the vertical conductive element.

FIG. 4E$_2$ illustrates the cross-sectional side view of FIG. 4E$_1$ during a sawing or singulation process.

DETAILED DESCRIPTION

Figure 1E:
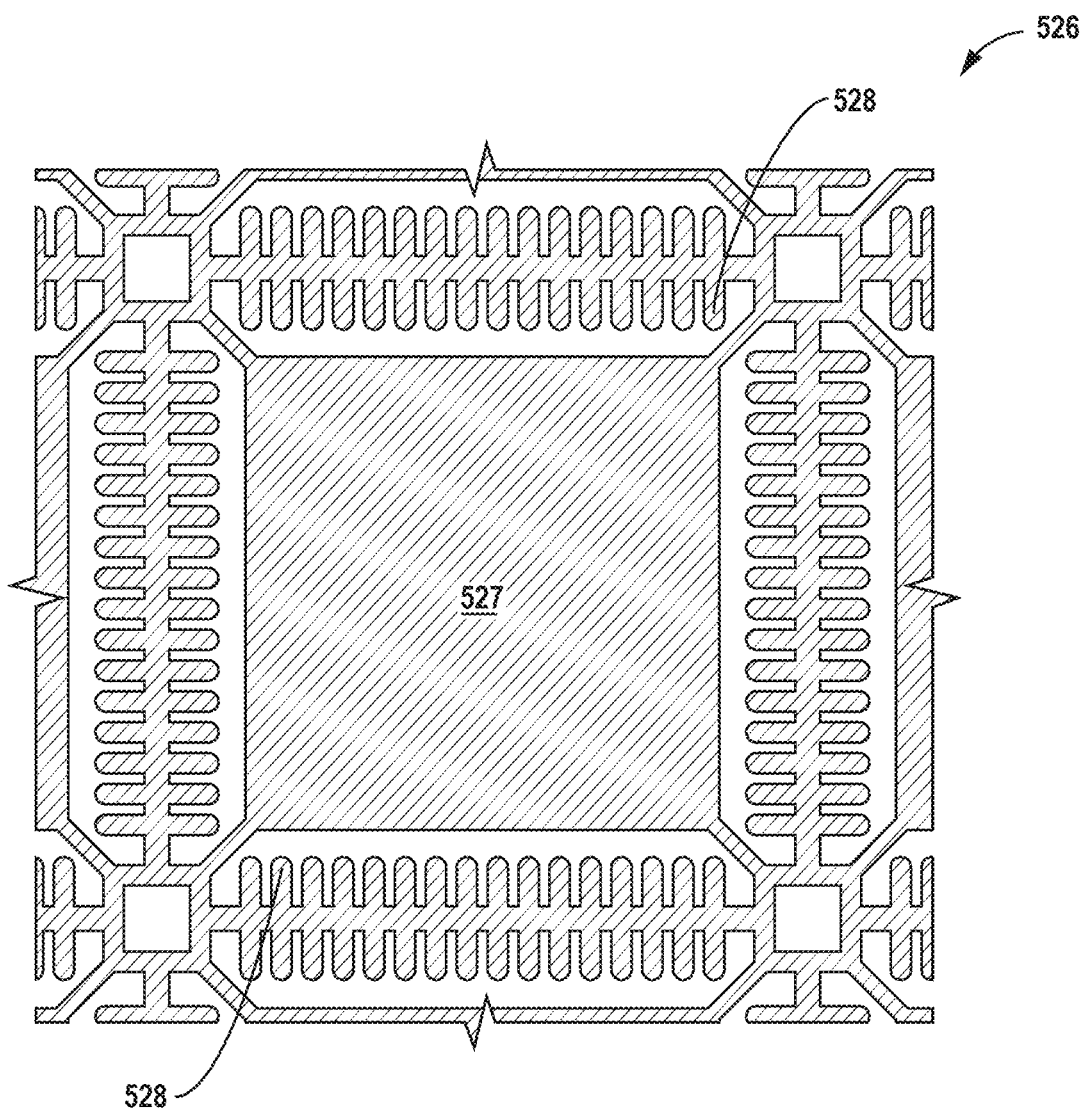
FIG. 1E illustrates a non-limiting example of a leadframe for mounting ICs or semiconductor chips.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGS. are illustrative representations and are not necessarily drawn to scale.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

This disclosure relates to a quad flat no-lead (QFN), dual flat no-lead (DFN) or a small-outline no-lead (SON) package without a leadframe and with molded direct contact interconnect build-up structures, and a method of making the same. A QFN, DEN or SON is a small-sized integrated circuit (IC) package that offers small size, low cost, and very good performance. FIG. 1A illustrates an image of a conventional QFN package 500 with side lengths of 5 mm. Those of ordinary skill in the art are familiar with conventional QFN, DFN and SON package structures.

No-lead packages such as QFN, DEN and SON packages physically and electrically connect to the surface of printed circuit boards (PCB's) or other substrates using surface mount technology, thus coupling the IC to the PCB or other substrate. In the surface mount technology illustrated in the conventional QFN package 500 of FIG. 1A and the close-up view in FIG. 1B, the land pads 502 are exposed on the upper surface 504 of the package 500 and on the side edges 506 of the package 500. In particular, a portion of the leadframe, called the tie bar 508, is cut and exposed along the side edges 506 during singulation of the packages. Additionally, when the packages 500 are singulated, such as by sawing or punching, burrs 510 can occur. Singulation by cutting can cause burrs 510 because the land pads extend to the edge 506 of the package 500, and the saw creates a burr 510 that extends from the land pads 502 caused by the saw heat and rotation as it cuts along the edge of the land pads 502. Singulation by punching can create burrs due to the need for clearance between the punch and die. In either event, the burring that extends in each of the X-, Y- and Z-planes is a known problem of QFN singulation and requires costly process measures to reduce them or additional processing to remove them.

FIG. 1C, and the close-up view of a corner of FIG. 1C as shown in FIG. 1D, emphasize that in some conventional packages 520, a "wettable flank" or wettable vertical surface of a traditional QFN, DEN or SON package extends along a side of the land pad 522.

The wettable flank is formed by sawing partially through the package and through the land pad 522 to create the channel 524 or additional edge around a perimeter of the package above the exposed periphery surface 521 of the land pad 522. This allows the solder fillets (not shown) to be more visible for quality checking after the package is mounted on a board through Automated Optical Inspection (AOI). AOI helps identify that a good electrical connection is formed with the land pad 522 and the solder by seeing when solder is exposed in the channel 524 or at the land pad 522. In the end, the QFN, DEN and SON packages include exposed copper on the outside, and particularly on the perimeter, surfaces of the packages through the cut land pads 510, 521 and through the cut leadframe 508. The exposed copper is prone to oxidation and is undesirable because it makes sidewall solder wetting difficult on the exposed surface 521.

QFN, DEN and SON packages are a near chip-scale plastic encapsulated package made with a metal leadframe substrate. FIG. 1E illustrates a non-limiting example of a leadframe 526 to which ICs or semiconductor chips may be mounted to die pad or flag 527. The lead tips 528 are separated from the flag 527, so as to be electrically separated from the flag 527 after singulation.

A leadframe 526 is the metal structure inside a leadframe-based chip package that creates leads which carry signals and power to and from the chip to the outside through metal conductors leading away from the chip. QFN, DFN and SON packages comprise perimeter land pads 502 and 522 (as seen in FIGS. 1A-1D) on the package edge 506 to provide electrical connections to the PCB, rather than using leads that extend beyond the body of the package. During packaging prior to singulation, the QFN, DEN and SON packages are in strip form, connected to adjacent packages on the leadframe. This also means that they are electrically interconnected through the conductive leadframe. The packages are later isolated or separated, such as by cutting or punching, to form separate packages. In conventional QFN, DEN and SON packages, partial sawing to isolate each unit electrically is required before testing to allow electrical testing of the individual packaged semiconductor chips.

The present disclosure relates to QFN, DEN and SON packages without a leadframe, and with molded direct contact interconnect build-up structures. An example of a molded direct contact interconnect build-up structure is known under the trademark or tradename MDx™. Molded direct contact interconnect build-up structures (and a method for making and using the same) are discussed in US Provisional Patent 63/347,516, the entirety of which is hereby incorporated herein by reference. Molded direct contact interconnect build-up structures may comprise or provide: (i) large area chip bond pad interconnect to create a very low contact resistance, (ii) removal of capture pads between build-up layers, such as traces, (iii) cost savings by removing polyimide and other polymers from the build-up layers, using mold compound instead, and (iv) facilitate ultra-high-density connections such as 20 micrometer bond pitch and smaller.

At least some of the above advantages are available at least in part by using unit-specific patterning (such as adaptive patterning (custom design and lithography) and build-up interconnect structures such as a frontside build-up interconnect structure, which is also known under the trademark "Adaptive Patterning," referred to as "AP." Unit-specific patterning: (i) allows for the use high-speed chip attach for semiconductor chips and AP will ensure alignment for high density interconnects with the molded direct contact interconnect build-up structures. Adaptive Patterning may also be used in the herein disclosed processes for manufacturing QFN, DFN and SON packages including the ability to make large area connections which are precisely aligned to chip bond pads for very low contact resistance.

Figure 2:
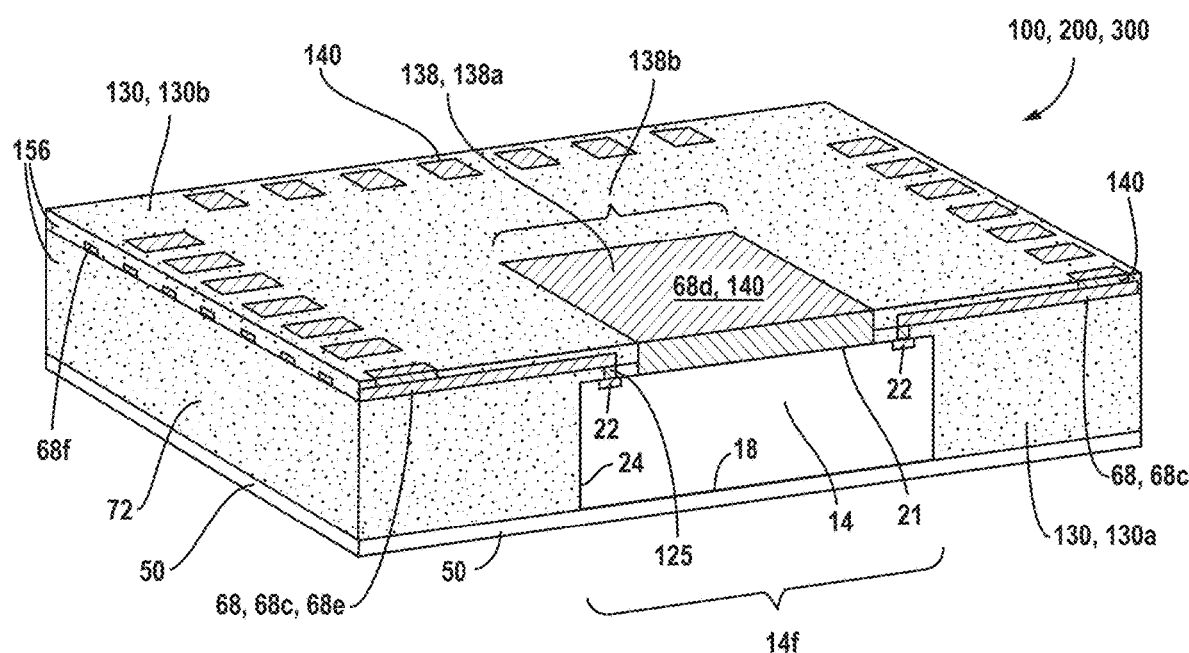
FIG. 2 illustrates a perspective view of a cross-sectioned portion of a QFN.
Figure 3A:
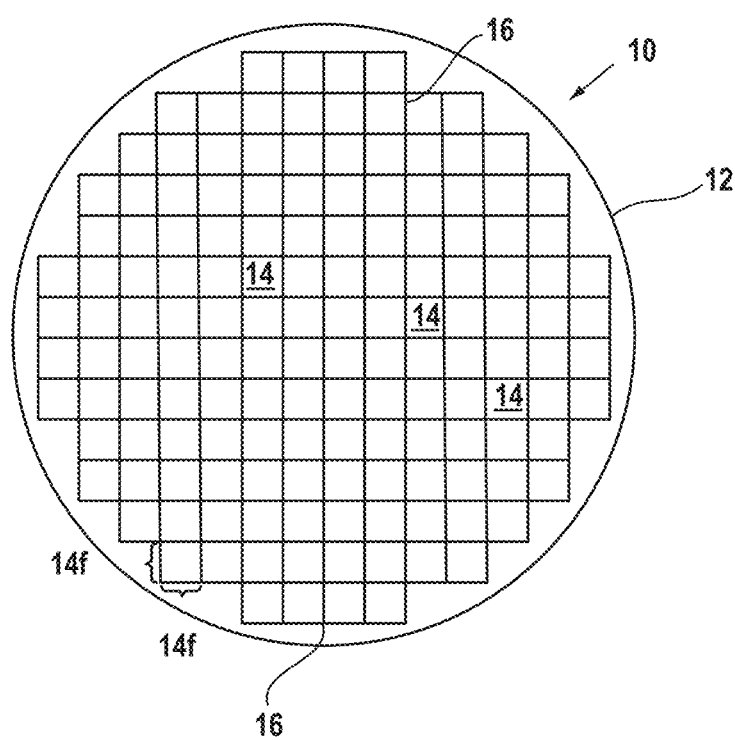
FIG. 3A illustrates a plan view of a semiconductor wafer or native wafer 10 comprising components disposed thereon.
Figure 3B:
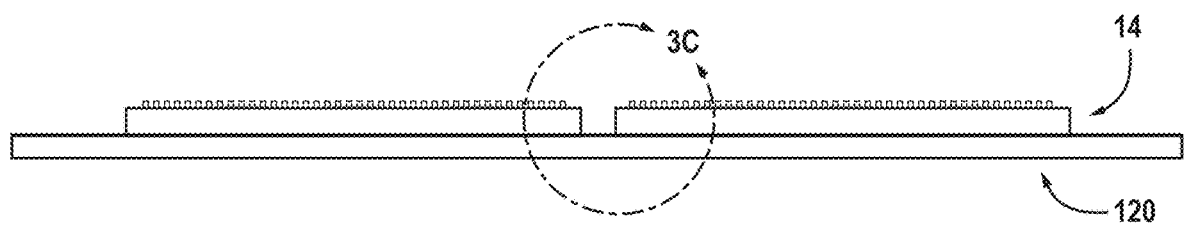
FIG. 3B illustrates disposing semiconductor chips over a temporary carrier.
Figure 3C:
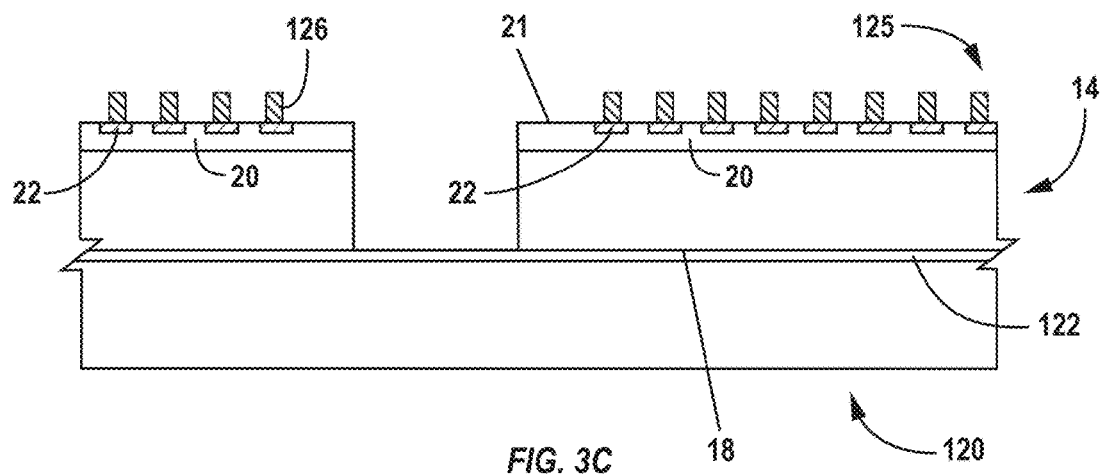
FIG. 3C shows a close-up view of the semiconductor chips taken at section marker 3C of FIG. 3B.
Figure 3D:
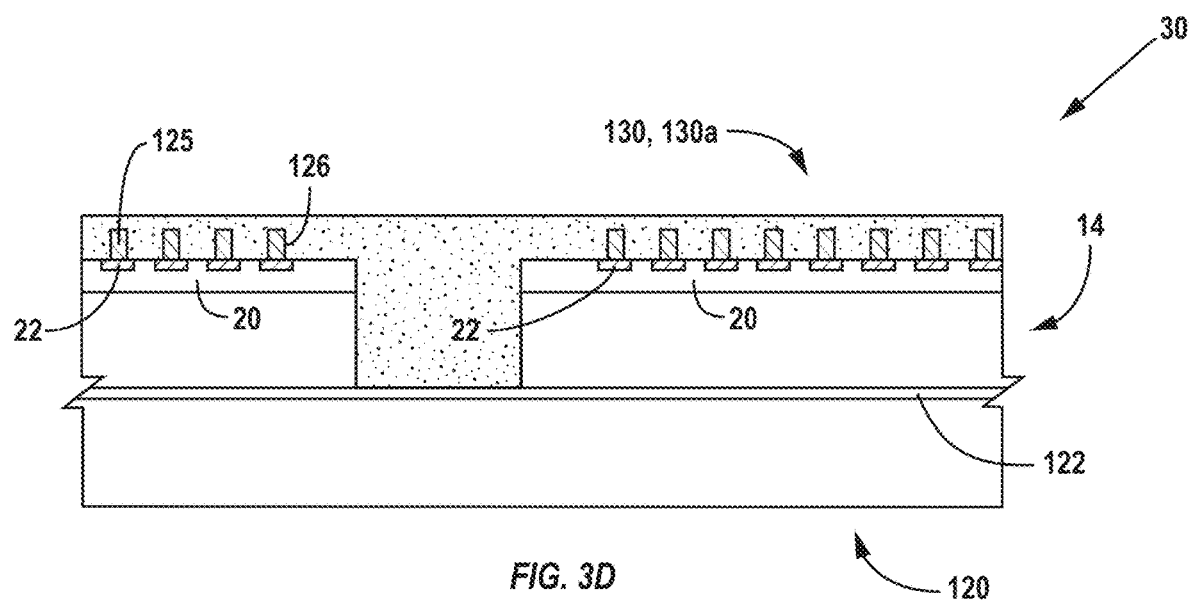
FIG. 3D illustrates disposing an encapsulant around the semiconductor chips over a temporary carrier.
Figure 3E:
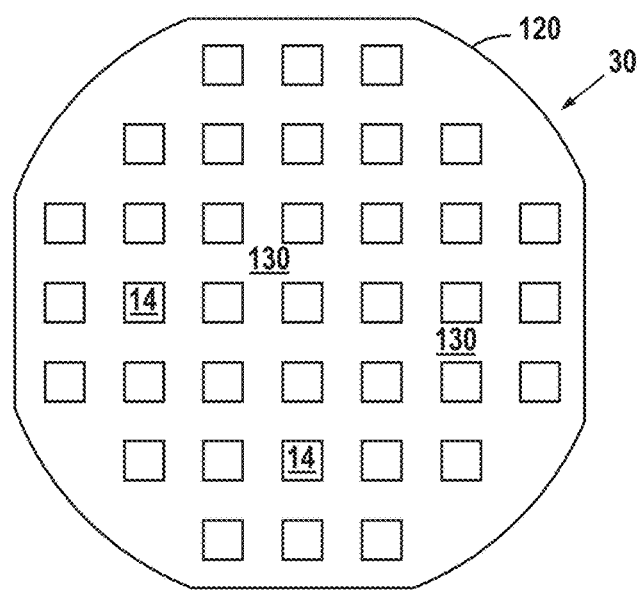
FIG. 3E illustrates a top view of an embedded chip panel, or reconstituted wafer, a portion of which is shown in the cross-sectional profile view of FIG. 3D.
Figure 3F:
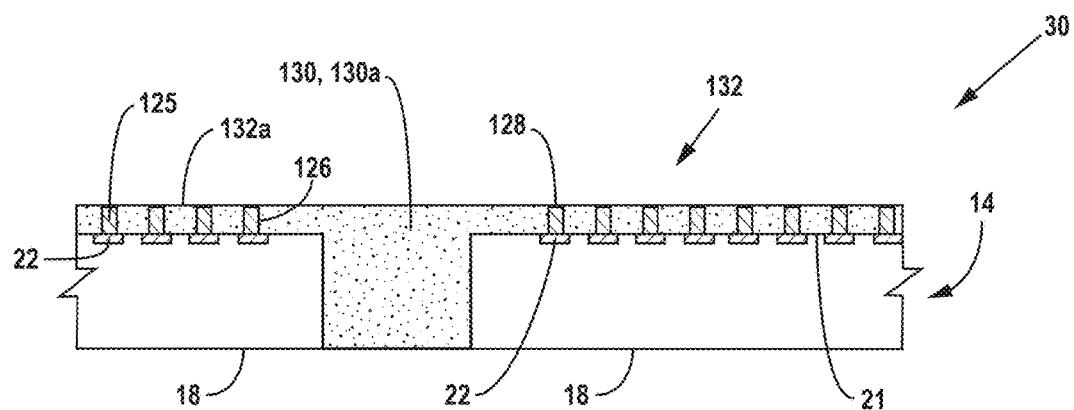
FIG. 3F shows removing a temporary carrier to expose a backside or back surface of the semiconductor chips.
Figure 3G:
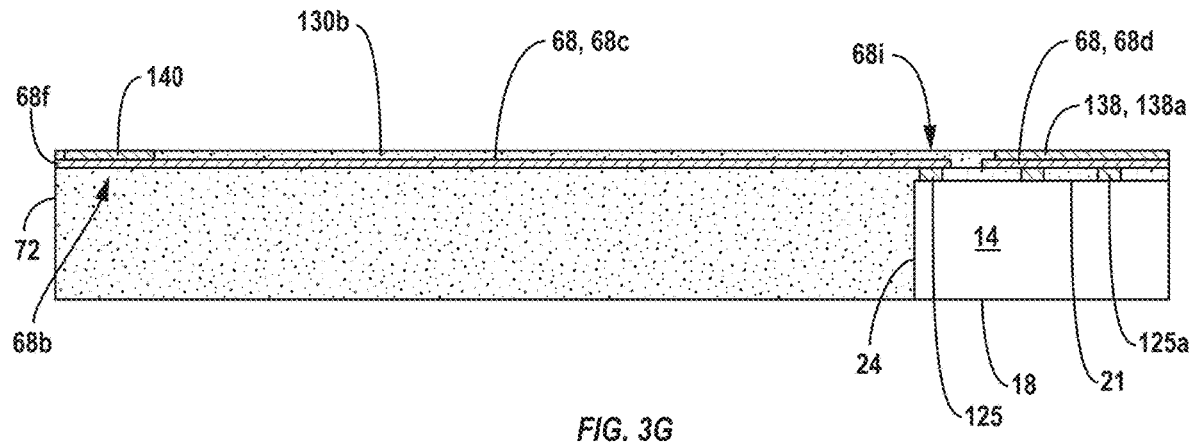
FIG. 3G illustrates a profile view of a portion of a semiconductor chip with one or more conductive layers plated over it.
Figure 3H:
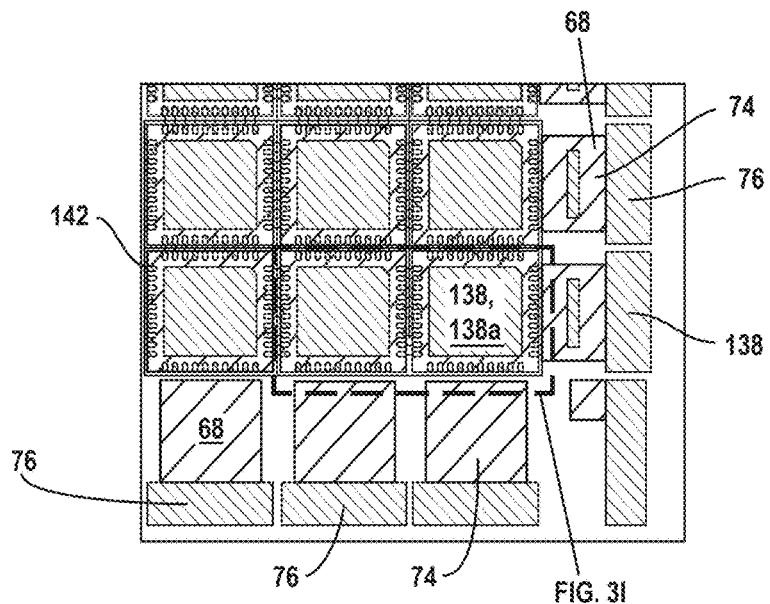
FIG. 3H illustrates a top or plan view of a bottom right corner of an embedded chip panel showing portions of nine (9) QFN, DEN, or SON packages being made.
Figure 3I:
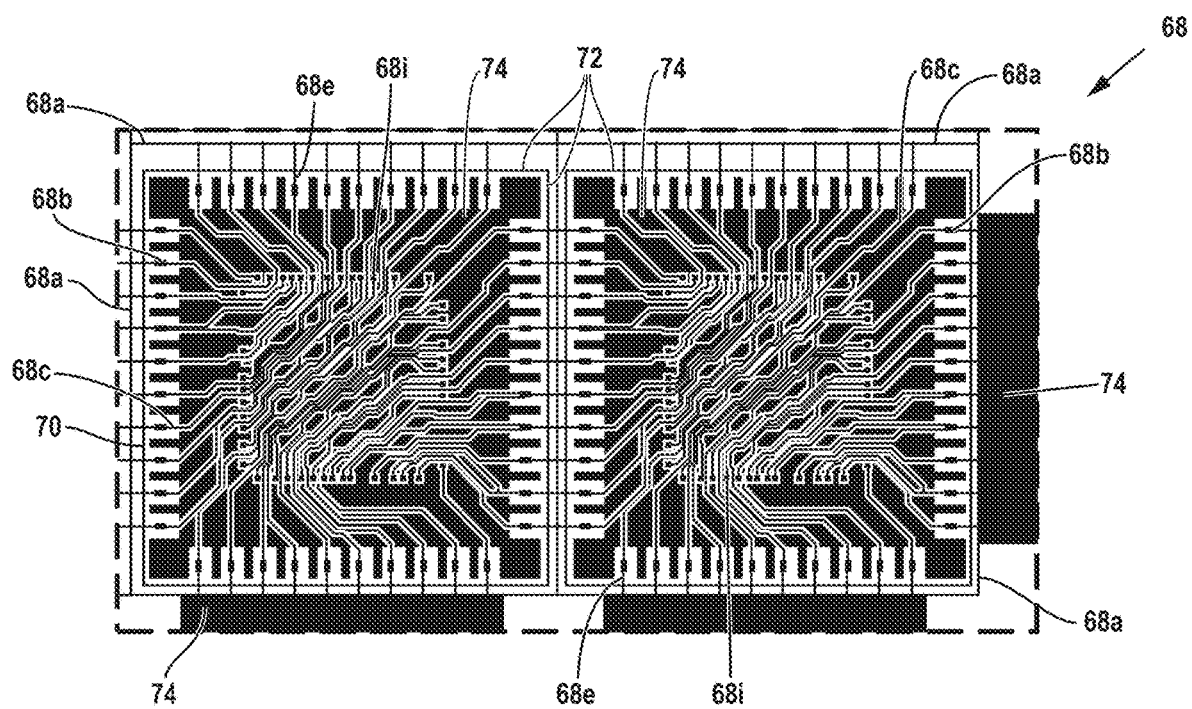
FIG. 3I illustrates a top or plan view of the bottom right corner of FIG. 3H showing a conductive layer.
Figure 3J:
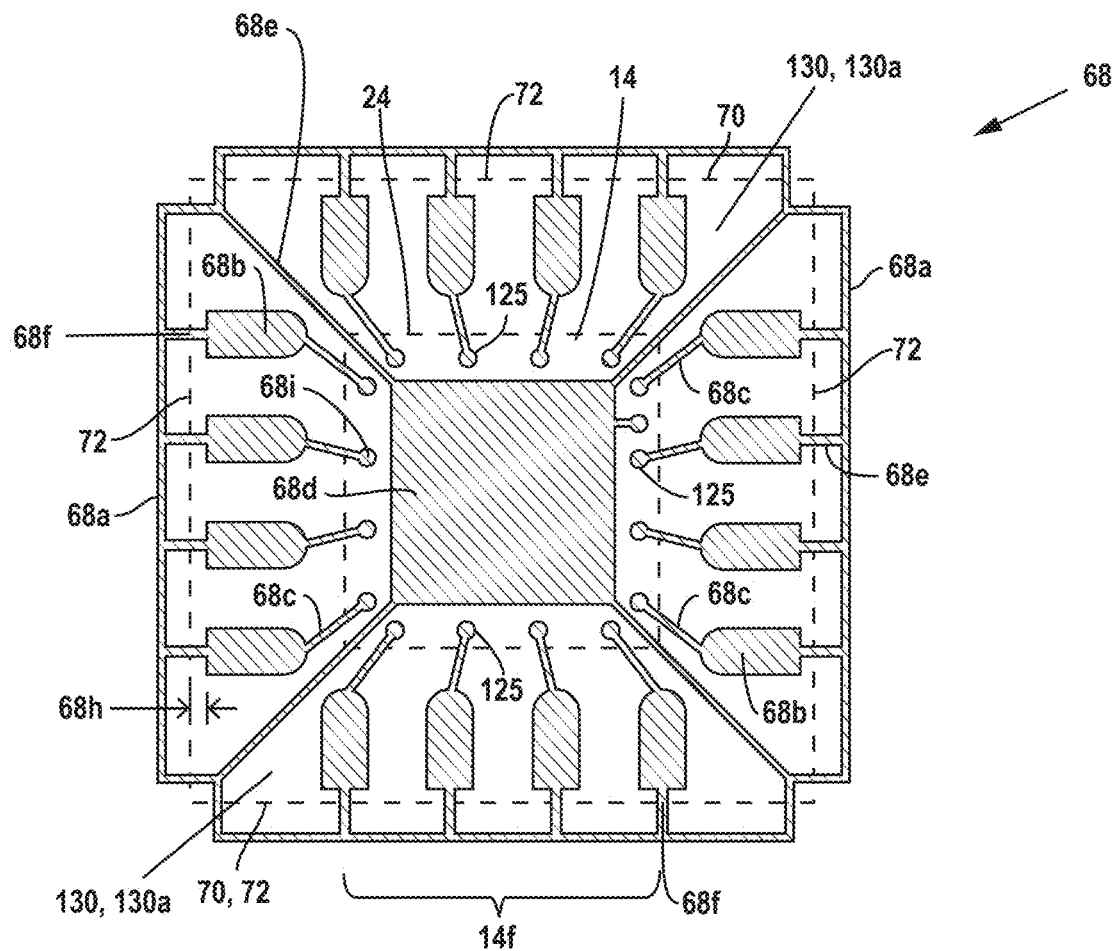
FIG. 3J depicts a semiconductor die embedded within encapsulant as part of a QFN, DEN, or SON package depicting a conductive layer disposed thereon.
Figure 3K:
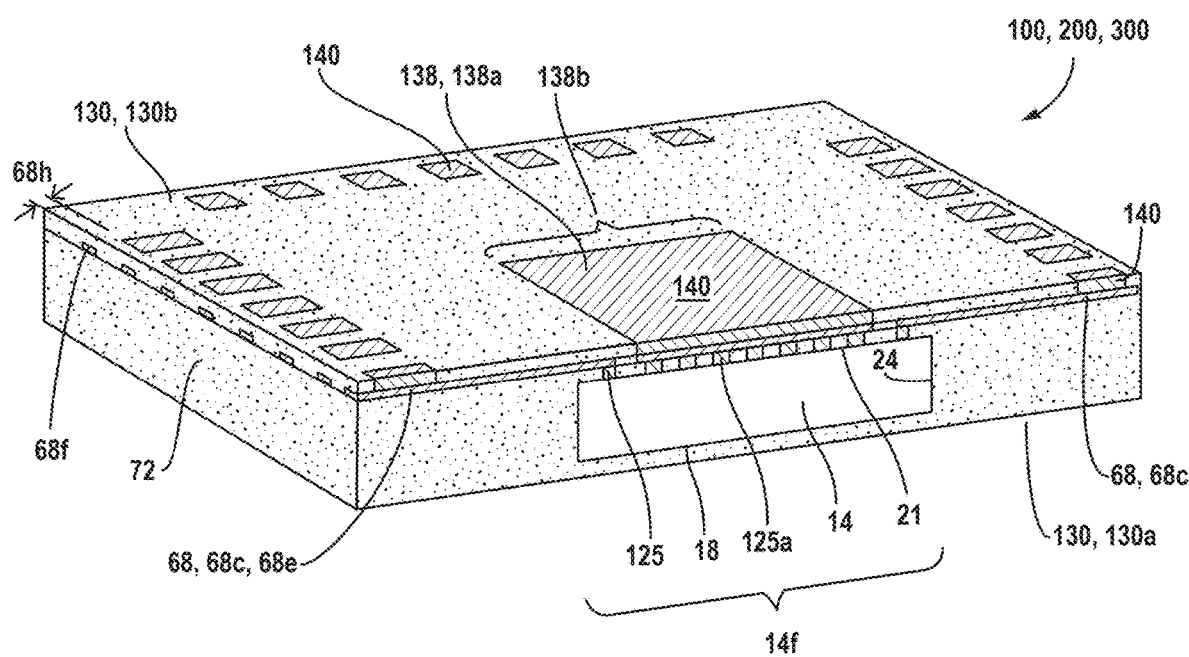
FIG. 3K depicts a semiconductor die embedded within encapsulant as part of a QFN, DEN, or SON package.
Figure 4A:
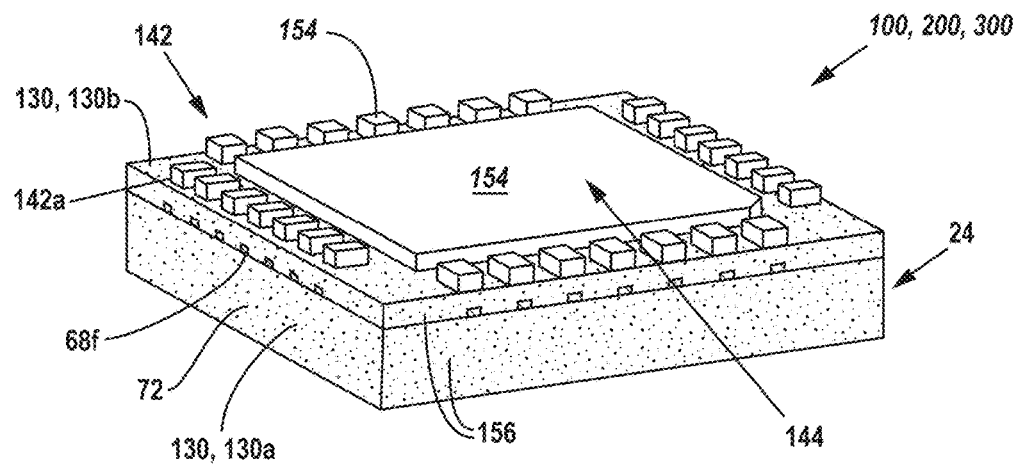
FIG. 4A illustrates a perspective view of a QFN, DEN, or SON package after singulation from the embedded chip panel.

FIG. 2 illustrates a perspective view of a cross-sectioned portion of a quad flat no-lead (QFN) package 100, similar to the views shown in FIGS. 3K and 4A, which illustrates features that could also be incorporated in a dual flat no-lead (DFN) package 200 or small outline no-lead (SON) package 300 package. The features as shown and described herein may be incorporated into a QFN 100, a DFN 200 and an SON 300 and as such, where the disclosure refers to specific embodiments, a person of ordinary skill in the art (POSA) would understand that it may apply to any of a QFN 100, a DFN 200 and an SON 300. The QFN 100, DFN 200 or SON 300 package can comprise a semiconductor chip, an embedded chip or embedded component 14 comprising an encapsulant 130, 130a disposed around 4 side surfaces, over active region 20 and contacting front surface 21 of the semiconductor chip 14. A fan-out, conductive layer 68, 68c, the fan-out layer hereinafter referred to as traces or redistribution layers (RDLs), may be disposed over the semiconductor chip 14 and over the encapsulant 130, 130a. The conductive layer 68c may comprise electrically isolated, conductive traces 68c and conductive tie bar portions 68e coupled with the traces 68c, wherein the tie bar portions 68e extend from the traces to a package edge 72 where cut tie bar ends 68f are exposed with respect to cut encapsulant 156 at edges 72 of the QFN package 100, DFN package 200, or SON 300 package. The cut tie bar ends 68f may comprise a cross-sectional area in a range of 5-20 micrometers-squared, and a cross-sectional area within this range facilitates singulating the packages using conventional singulation methods such as using a nickel bond blade during sawing or singulation, in contrast to other package structures known in the art which have greater amounts of exposed metal at the package edge. This is further depicted and similarly applies to FIGS. 3G, 3K, 4A-4C. A second encapsulant 130, 130b is disposed over the conductive layer 68c with openings formed through the encapsulant. Electroplated vertical conductive elements 140 are formed over the conductive layer 68 and contact pads 68b. While not depicted for all figures for simplicity, in embodiments according to FIG. 4D$_1$, land pads 142 may be electroplated over the vertical conductive elements 140 and may further comprise a pad finish 154 electroplated thereon. In further embodiments according to FIG. 4E$_1$, pad finish 154 may be electroplated directly onto vertical conductive elements 140. The portions of the conductive layer 68 having contact pads 68b and contact base 76 make it such that specially formed plating contacts 76 (depicted in FIG. 3H) on the LGA1 layer 138 are not needed and contact for electroplating may be made by contacting the conductive layer 68 and contact base 76 to plate both the LGA layer 138 and land pads 142.

Figure 7:
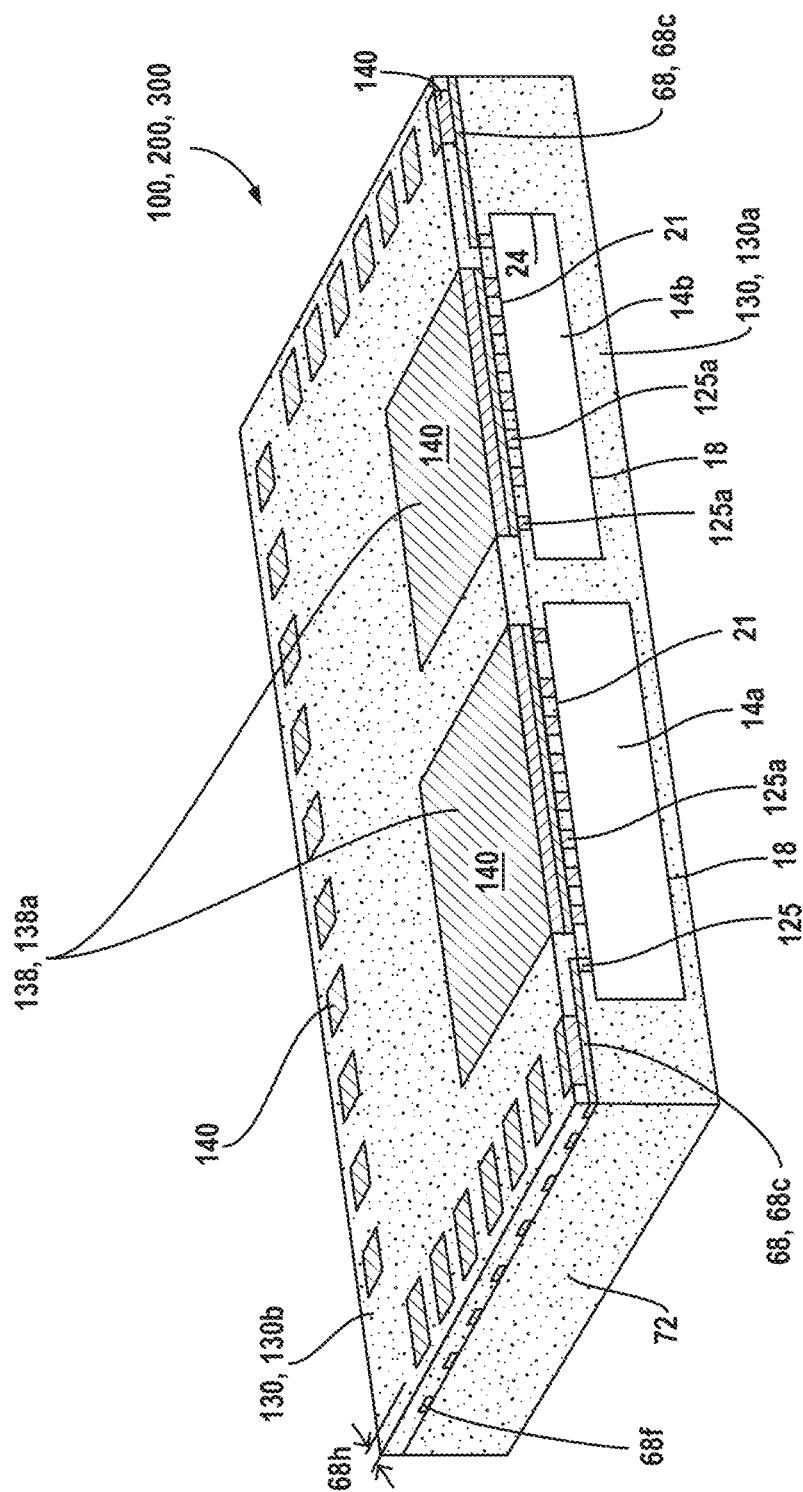
FIG. 7 illustrates QFN, DEN and SON packages comprising two semiconductor chips or components.

FIG. 2 further illustrates that the semiconductor chip 14 comprises conductive studs coupled to a front surface 21 over an active layer 20 of the semiconductor chip, and encapsulant disposed over the active layer of the semiconductor chip, which encapsulant contacts a side surface of the conductive studs. Any or all of the QFN, DFN, or SON packages as disclosed herein may be formed using unit specific patterning, where a misalignment between embedded components and conductive layers is less than a misalignment between embedded components and a package edge. A backside laminate 50 may be disposed over backside 18 of chip or component 14 and a backside of encapsulant 130. The backside laminate 50 may be of any suitable dielectric insulating, or passivation layer, that may be the different than encapsulant 130. In other instances, encapsulant 130 or other material may be present (as illustrated in FIG. 3K or FIG. 7), or the backside 18 of the chip or component 14 can be exposed.

FIG. 3A illustrates a plan view of a semiconductor wafer or native wafer 10 with a base substrate material 12, such as, without limitation, silicon, germanium, gallium arsenide, indium phosphide, or silicon carbide, for its semiconducting capability and for structural support. A plurality of semiconductor chip 14 or components can be formed on wafer 10 separated by a non-active, inter-chip wafer area or saw street 16 as described above. The saw street 16 can provide cutting areas to singulate the semiconductor wafer 10 into the individual semiconductor chips 14.

Each semiconductor chip 14 may comprise a backside or back surface 18, an active layer 20 opposite the backside, and a front surface 21. The active layer 20 contains one or more circuits or discrete components of any kind implemented as one or more active devices, passive devices, conductive layers, and dielectric layers formed within or on the chip 14 and electrically interconnected according to the electrical design and function of the semiconductor chip 14.

For example, the circuit may include, without limitation, one or more transistors, diodes, and other circuit elements formed within active layer to implement analog circuits or digital circuits, such as DSP, ASIC, memory, or other signal processing circuits. The semiconductor chip 14 may also contain passive devices such as inductors, capacitors, and resistors, for RF signal processing, digital power line control or other functions. The semiconductor chip 14 may consist only of conductive routing layers and associated dielectric layers such as for use as a bridge chip between active devices or other electrical function. The semiconductor chip 14 may also be added as one of many chips being added simultaneously on a carrier. The semiconductor chip 14 may also be only a dummy substrate with no electrical function, but rather act merely as a structural element, and in such instance may be referred to as an embedded device 14. Embedded device 14 may further comprise one or more of a passive device, dummy chip, bridge chip, and IPD sensor. In some instances, the embedded device 14 may comprise connections on both sides of the chip 14. The principles and structures taught in relation to this disclosure are applicable to known existing technologies that are compatible with the QFN, DEN or SON packages disclosed without a leadframe and using direct contact interconnect build-up.

FIG. 3B illustrates disposing semiconductor chips 14 face-up over a temporary carrier 120, the semiconductor chips each comprising conductive studs 125 over the active layer 20 of the semiconductor chips 14. Face-up as used herein means where the conductive studs 125, active layer 20 and front surface 21 of the semiconductor chip 14 are disposed away from temporary carrier 120 such that backside 18 contacts temporary carrier 120. Face-down means where the conductive studs 125, active layer 20 and front surface 21 of the semiconductor chip 14 are disposed towards temporary carrier 120.

In other instances, semiconductor chips 14 may be disposed face-down over the temporary carrier 120, and then subsequently have encapsulant 130, 130a disposed around the chips 14, similar to what is described with respect to FIG. 3D. In instances where the semiconductor chips 14 are mounted face-down, the conductive studs 125 may be formed before or after the encapsulant 130, 130a is disposed around the semiconductor chips 14. In some instances, conductive studs 125 will be formed before encapsulant 130, 130a is applied, such as by molding, and the encapsulant 130, 130a may be vacuum drawn around the conductive studs 125. In other instances, the semiconductor chips 14 may be placed face down on the temporary carrier 120 and molded without conductive studs 125 being present; after which, the temporary carrier 120 is removed to expose chip bond pads over which conductive studs 125 may be optionally formed then overmolded, to yield a structure like that illustrated in FIG. 3F.

The conductive stud 125 is a conductive interconnect structure that has generally vertical sides and is typically wider than it is tall, built-up on a substrate, such as over an active layer of a chip, polyimide or mold compound. The conductive stud 125, though typically formed of the same materials as a pillar or post would be formed, is different than a pillar or post which each has a height greater than its width. The conductive stud 125, though it commonly is formed in a cylindrical shape, may be formed in any polygonal or other shape and size. Another use for a conductive stud 125 is as a dummy thermal conductive stud 125a that is not electrically coupled to an active electrical circuit but is instead thermally coupled to a heat source of an active device to dissipate the heat to another structure, such as to a pad on a surface of the package. The generally vertical sides of a conductive stud 125 are different from the sides shape that exists for a solder ball or a squished out solder ball that has generally rounded sides, because the generally vertical nature of the conductive stud 125 comes from imperfections in being formed in a structure that has been previously developed or etched, such as within openings in a photoresist layer. Developing or etching does not generally perfectly or uniformly remove the photoresist within the openings, and therefore forms imperfect, generally vertical openings for deposition of the conductive stud 125. Generally vertical includes perfectly vertical and imperfectly vertical sides. The conductive stud 125 is not a wire bond or solder.

In some instances, the semiconductor chips 14 will have a thickness (shown in the vertical direction, bottom to top, of the page) of between about 25 µm to about 150 µm for thin ground wafers, or about 100 µm to about 800 µm for thick ground wafers. In some instances, the temporary carrier 120 may be a metal carrier, a silicon carrier, a glass carrier, or a carrier made of other suitable material used for the molding or encapsulating process, and then be removed after the encapsulant 130, such as mold compound, filled epoxy film such as ABF, or other dielectric such as polyimide has been placed, cured, or both, such that the encapsulant 130 provides structural support and the temporary carrier 120 is no longer needed for processing. The semiconductor chips 14 may be placed adjacent one another, such as in a side-by-side arrangement, so that multiple chips 14 may be formed at a re-constituted wafer or panel level 30 and processed through various fabrication steps, before being singulated into individual QFN, DEN or SON packages. As such, multiple chips 14 may also be processed together at a same time over the temporary carrier 120, which will be understood by a person of ordinary skill in the art (POSA), even when a close-up view of just portions of the semiconductor chips 14 are shown.

FIG. 3C illustrates a close-up view of the semiconductor chips 14 taken at section marker 3C of FIG. 3B, emphasizing the conductive studs 125 (e.g. may be formed of copper) having sidewalls 126 may be formed over the active layer 20 and over front surface 21, and aligned on the semiconductor chips 14. Although it is not required for every embodiment, the conductive studs 125 of the particular embodiments illustrated herein are shown about a perimeter of the semiconductor chips 14 for the particular implementation in which they will be used. In other embodiments, such as for power and ground or thermal management, conductive studs 125 and thermal studs 125a may further be disposed within an interior of the semiconductor chips 14. An optional interface layer 122, such as double-sided tape, film or deposited material, may be used beneath the semiconductor chips 14 to temporarily hold them to the temporary carrier 120 during processing.

FIG. 3D, continuing from FIG. 3C, illustrates forming an embedded chip panel 30 comprising a plurality of semiconductor chips embedded in encapsulant and separated by saw streets. The embedded chip panel 30 is formed by disposing an encapsulant 130, 130a around the semiconductor chips 14 face-up over a temporary carrier 120 around four side surfaces of the semiconductor chip 14, over the active layer 20 of the semiconductor chips 14, and around the conductive studs 125, and contacting sidewalls 126 of the conductive studs 125. As used herein, over, on or around may mean in direct contact with, or with other intervening layers, such as polymer or polyimide layers disposed between the chips 14 and the encapsulant 130. The conductive studs 125 formed over the active layer 20 of the semiconductor chips 14 may be in contact with, surrounded by, partially encircled by, or encapsulated or molded with a single encapsulant, polyimide or mold compound at a single step such that the same encapsulant, polyimide or mold compound 130 is disposed around the semiconductor chips 14. The encapsulant 130 can be deposited around the plurality of semiconductor chips 14 using a paste printing, compression molding, transfer molding, liquid encapsulation, dispensing, lamination, vacuum lamination, spin coating, slit or slot die coating, or other suitable application. The encapsulant 130 comprises an organic material, a mold compound, a polyimide, a composite material, such as epoxy resin with filler, such as ABF or epoxy acrylate with filler, and is a material suitable for planarizing, such as through chemical mechanical planarizing (CMP) or grinding. As such, in some instances the encapsulant 130 will not be a polymer material, such as an un-filled polyimide, that does not perform well in a grinding operation, and may gum-up a grinding wheel. FIG. 3F illustrates the exposed planar surface 132 with the interconnect structures 125 exposed.

FIG. 3E illustrates a top view of the embedded chip panel, or reconstituted wafer 30, a portion of which is shown in the cross-sectional profile view of FIG. 3D. FIG. 3E illustrates a temporary carrier, a reusable carrier, a sacrificial carrier, or any suitable carrier 120, made of metal, glass, silicon, mold compound, or other suitable material, with a release layer. The carrier 120 may comprise a form factor or footprint of a wafer (circular footprint), a panel (square or rectangle), or of any suitable shape and may comprise a diameter or width of 200-600 mm, such as 300 mm, or of any other suitable size. The embedded chip panel 30 comprises semiconductor chips 14 disposed in encapsulant 130.

FIG. 3F, continuing from FIGS. 3D and 3E illustrates that after molding, the temporary carrier 120 may be removed, and a backside or back surface 18 opposite front surface 21 of the semiconductor chips 14 may be exposed from the encapsulant 130, 130a. Alternatively, a backside laminate, encapsulant, die attach film (DAF) or other material may be disposed over the backside of the semiconductor chips 14. Thus, in some instances the backside laminate (including polyimide or mold compound) may be more than temporary and may become part of the final product, or may be removed at a later process step, such as at a grinding or polishing step. Different processing steps may be included to result in the backside 18 of the semiconductor chip 14 being exposed with respect to, or covered by, encapsulant or other material.

FIG. 3F further illustrates planarizing or grinding the encapsulant 130, 130a over the active layer 20 or front surface 21 to expose the conductive studs 125, which may occur before or after removing the temporary carrier 120. Planarizing the encapsulant over or front surface 21 of the semiconductor chips 14 to create a planar surface 132 further exposes ends or planarized ends 128 of the conductive studs 125, also forming a planarized encapsulant surface 132a. The planarizing or grinding of the encapsulant 130, 130a produces a flatness of within a range of about 0.5-5 micrometers and a total roughness height from peak to valley measured over a 1 millimeter (mm) length of between 5 and 500 nanometers (nm). While conventional encapsulant grinding might be done with less flatness, greater accuracy and precision can be obtained by using integrated sensors such as laser, acoustic, or other non-contact methods to control the grinding resulting in better flatness. In some instances, the conductive studs 125 may be formed with a height of less than or equal to about 50 micrometers (μm) or less than or equal to about 250 μm, and then be ground down to a height of less than its original height, such as, in a particular embodiment, less than or equal to about 4 μm or 1 μm. As used herein, "about" or "substantially" means a percent difference less than or equal to 50% difference, 40% difference, 30% difference, 20% difference, 10% difference, or 5% difference.

FIG. 3G illustrates a profile view of a portion of semiconductor chip 14, similar to the view of FIG. 3F, and forming a conductive layer 68 over the embedded chip panel 30 (the conductive layer comprising one or more first formed seed, barrier, and adhesion layers) plated over the flat or planar surface 132 of encapsulant 130, 130a, over the planarized encapsulant surface 132a and over planarized ends 128 of the conductive studs 125 as seen in FIG. 3F. A blanket seed layer (which may further comprise barrier and/or adhesion layers) may be formed over the planar surface 132 of first encapsulant 130, 130a, followed by photoresist deposition, cure and patterning (not shown). Thereafter the conductive layer 68 may be electrodeposited, followed by removal of the photoresist by dry or wet stripping processes as known in the art. The blanket seed layer may be chemically etched for removal. The conductive layer 68 may comprise traces 68c, bussing lines 68a, tie bars 68e, contact pads 68b, contact base 74 (as seen in FIG. 3H) and other features as discussed in more detail with respect with FIGS. 3H, 3I and 3J, formed over one or more semiconductor chips 14. The traces 68c may extend beyond an edge of the semiconductor chips 14 and coupled with conductive studs 125 coupled to the plurality of semiconductor chips 14 and bussing lines 68a may be formed so as to pass over one or more saw streets edges or package edges 72.

After a second photoresist deposition, cure and patterning as previously discussed, an additional conductive layer or land grid array (LGA1) layer 138 (shown in FIG. 3H) may subsequently be electroplated to form vertical conductive elements 140 and in some instances to form pads, thermal pads, center exposed interior pads or ground pads 138, 138a over the conductive layer 68. The additional conductive LGA1 layer 138 may be electroplated by providing current through the bussing lines 68a and tie bars 68e of the conductive layer 68 (RDL layer), which may extend to an edge 72 of the package. Thus, the land pads 142 and interior pads 138a may be formed as part of additional conductive layer 138 by electroplating without the use of a barrier layer or adhesion layer or seed layer. The second photoresist layer may be removed as aforementioned and as known in the art. In further embodiments, a photosensitive polyimide (PSPI) in lieu of the first or second photoresist layer may be used.

With respect to the seed layer 131 (shown in FIGS. 4D$_1$-4F), and the subsequently formed conductive layer or RDL layer 68, FIG. 3G shows an electrically conductive layer 68 is formed over the embedded chip or semiconductor chip 14. The one or more seed 131, barrier, or adhesion layer and conductive layer 68 can be one or more layers of Al, Cu, Sn, Ni, Au, Ag, Ti—Cu, TiW—Cu, TiN—Cu, Ta—Cu, TaN—Cu or a coupling agent like Cu. The seed layer 131 and conductive layer 68 may be deposited by sputtering, by electroless plating, by electroplating, by depositing laminated Cu foil combined with electroless plating, or other suitable process. In an embodiment, the seed layer 131 and the conductive layer 68 is flat or planar. The seed layer 131 may cover an entirety of an upper surface of the embedded chip panel 30 and form a plating buss for subsequent plating of the conductive layer. A patterning layer (not shown; such as a patterned photoresist layer, discussed below) can direct where the conductive layer is formed. Thus, the seed layer and the conductive layer can cover both the top surface or an area over semiconductor die 14 as well as a peripheral area disposed outside a footprint of the semiconductor die, such as gaps and saw streets.

A patterning layer, such as photoresist, may be conformally applied over the embedded chip panel 30 and be patterned to facilitate the formation of the conductive layer 68. In an embodiment, the patterning layer is a dry film resist layer. The patterning layer may be patterned and a portion of the patterning layer may be removed by developing, laser direct imaging (LDI) and developing, etching, laser drilling, or other suitable process to form openings completely through patterning layer and to expose the conductive seed layer 131 for subsequent plating or formation of the conductive layer 68. Patterning layer may be patterned to facilitate the formation of traces 68c, bussing lines 68a, tie bars 68e, and reinforcement strips 74. The patterning layer may also be patterned to facilitate the formation of contact pads 68b and traces or redistribution layers (RDLs) 68c as part of a fan-out interconnect structure for semiconductor chips 14 that are coupled or connected to the bussing structures 68a when plated as shown, e.g., in FIGS. 3H-3J, as described in greater detail following.

FIG. 3H illustrates a top or plan view of a bottom right corner of an embedded chip panel 30 showing portions of nine (9) QFN, DEN, or SON packages being made. The conductive layer (or RDL layer) 68 shown in FIG. 3H may be formed over the embedded chip panel 30. The conductive layer 68 comprises traces 68c, bussing lines 68a, tie bars 68e, and a contact base or reinforcement strip 74, which may comprise part of conductive layer 68, for subsequently formed plating contacts 76, which are part of the LGA1 layer 138. In the final plating configuration, contact base or reinforcement strip 74 may extend under plating contacts 76 for electrical continuity and because plating contacts 76 tie into the plating busses 68a formed in 68, plating contacts 76 can subsequently be used to electroplate the pad finish materials or SMS 154. The traces or RDLs 68c are formed over the plurality of semiconductor chips 14 and coupled with conductive studs 125 coupled to the plurality of semiconductor chips 14. The bussing lines 68a are formed over, and extend along or through, the saw street edges or package edges 72 (shown in FIGS. 3I and 3J, following) between the semiconductor chips 14. The tie bars 68e extend between, and are coupled with, the traces 68c and the bussing lines 68a. The contact base or reinforcement strip 74 for subsequently formed plating contacts 76 can also extend outwards around a perimeter of the embedded panel or reconstituted wafer 30 to help provide mechanical strength and provide a connection to the subsequently formed plating contacts 76 as part of the LGA1 layer 138.

The conductive layer 68 can also be formed using unit-specific patterning to align the conductive layer 68 with a true position of a plurality of semiconductor die 14. When positions of semiconductor die 14 and conductive studs 125 shift from nominal positions such as during placement and encapsulation of the semiconductor die for formation of the embedded chip panel 30, the true or actual positions of the semiconductor die 14 may not sufficiently align with the nominal design of the conductive layer 68, including RDL and trace positions, for the structure to provide desired reliability for package interconnections given desired routing densities and pitch tolerances. When shifts in the positions of semiconductor die 14 are small, no adjustments to the positions of the conductive layer 68 may be required to properly align stud bonding portions 68i as part of the conductive traces 68, 68c with the conductive studs 125. However, when changes in the positions of semiconductor die 14 are such that the nominal position does not provide adequate alignment with, and exposure to, the conductive studs 125, then adjustments to the position of the conductive layer 68 can be made by unit-specific patterning (or "Adaptive Patterning™" as described in greater detail in U.S. patent application Ser. No. 13/891,006, issued as U.S. Pat. No. 9,196,509, titled "Adaptive Patterning for Panelized Packaging" filed May 9, 2013, the disclosure of which is hereby incorporated herein by reference. Unit-specific patterning can optionally adjust the position of features of the conductive layer (including traces, bussing lines, and tie bars) for each semiconductor die 14 individually, or can adjust positions for a number of semiconductor die 14 simultaneously. The position, alignment, or position and alignment of features of semiconductor die 14 can be adjusted by an x-y translation or by rotation of an angle θ with respect to their nominal positions or with respect to a point of reference or fiducial on the embedded chip panel 30.

An additional conductive layer (LGA1) layer 138 may be formed over the conductive layer 68, as shown in FIG. 3H. The additional, LGA1 layer 138 may be formed by electroplating land pads 142, thermal pads or ground planes 138a, and plating contacts 76 within the additional conductive LGA1 layer 138 by providing a current through the conductive layer 68 (including through the bussing lines and tie bars), by which the land pads 142, thermal pads or ground planes 138a, and plating contacts 76 are electroplated without a temporary photoresist layer, without a seed layer or an adhesion-barrier layer, and within the openings formed through the second encapsulant 130, 130b. The plating contacts 76 may be disposed at a periphery of the reconstituted wafer or panel 30 and separated from the plurality of semiconductor chips 14 by a portion of the saw streets 72 and the contact base 74 ("reinforcement strip"). In some embodiments, the conductive layer 68 may comprise reinforcement strips or contact base 74 formed around a periphery of the embedded chip panel 30.

The LGA1 layer 138 can be one or more layers of Cu, Sn, Ni, Au, Ag, or other suitable electrically conductive material. The deposition of the LGA1 layer 138 may be formed as part of an additive process on a molded panel 30 using a plating process (such as electrolytic plating or electroless plating) as described. In some other instances, another additive process may be used, such as PVD, CVD, or other suitable process. In an embodiment, the conductive LGA1 layer 138 is formed over the seed layer by an electro-plating process that uses the seed layer as a plating surface. The LGA1 layer 138 or land pads 142 may also be formed using unit-specific patterning to align the conductive layer with a true position of a plurality of semiconductor die (as described in greater detail below). LGA1 layer 138 comprises a thickness in a range of 10-35 micrometers (μm), or a thickness greater than 20 μm, or a thickness greater than 25 μm. Land pads 142 provide mechanical and electrical interconnection, such as with a subsequently formed tin layer, bumps, or package interconnect structures that provide for the transmission of electrical signals between semiconductor die 14 and points external to the QFN, DFN, or SON packages. The interior pads 138, 138a can provide multiple benefits, including a thermal conduction path for cooling of semiconductor die 14 (i.e. heat transfer and heat dissipation), as well as provide an electrical ground or power bus for the package. The plating contacts 76 may be electroplated over the conductive layer 68 by providing a current through the bussing lines and tie bars, wherein the plating contacts 76 are electroplated without a photoresist layer and within the openings formed through the encapsulant, wherein the plating contacts 76 comprise a thickness greater than or equal to 25 micrometers of copper. The plating contacts 76 (together with the reinforcement strips 74 below them) provide a reinforced structural feature and conductive contact points for subsequent plating, such as with a detachable conductive ring that may be disposed around the embedded chip panel 30 for subsequent plating. Subsequent plating comprises electroplating as one or more layers of matte tin, Ni—Pd—Au, Ni—Au, Au, Ag, and solder over the land pads 142, thermal pads and/or ground pads. In some embodiments, subsequent plating further comprises electroplating a pad surface finish 154 by providing a current through the bussing lines and tie bars, over the land pads 142 and/or over the interior pads, thermal pads or ground pads 138, 138a as one or more layers of matte tin, Ni—Pd—Au, Ni—Au, Au, Ag, and solder.

FIG. 3I illustrates a top or plan view of a bottom right corner as shown within the dashed box of FIG. 3H, and without the LGA1 layer 138 formed over the conductive layer or RDL layer 68. The conductive layer 68 comprises traces 68c, comprising stud bonding portions 68i, bussing lines 68a, tie bars 68e, and reinforcement strips or contact base 74 disposed between and around the traces 68c. The conductive layer 68, or portions thereof, may be formed using adaptive patterning.

FIG. 3J shows a simplified schematic plan view (with respect to FIG. 3I) of the conductive layer 68 for one package. FIG. 3J shows semiconductor die 14 embedded within encapsulant 130, 130a as part of a QFN, DEN, or SON packages having a package outline 70 defined by the saw street edges 72. Conductive layer 68 is shown formed into a number of features 68a-68g and 68h as part of the QFN, DFN, or SON package. Conductive layer 68 includes bussing lines or a bussing structure 68a that connects various features of conductive layer 68 and facilitates plating of additional conductive material for the formation of input/output (I/O) interconnect structures. A portion of bussing lines 68a are formed in saw streets 72, that can surround a periphery of the QFN, DFN, or SON package, and are subsequently removed during singulation of individual QFN 100, DEN 200, or SON 300 packages through the saw streets 72. The conductive layer 68 comprises traces 68c, bussing lines 68a, tie bars 68e. Disposed between the tie bars 68e and traces 68c are contact pads 68b as part of conductive layer 68, onto which LGA pads 142 may subsequently be formed as further described following. Similarly, additional layers, such as one or more ground planes, non-electrically conductive fill material which is electrically isolated, electrically conductive fill material providing electrical benefit as a ground plane, power plane, or thermal pad and similar features may be formed over the center exposed interior pad or ground pad 68d. Tie bars 68e may extend between and coupled with the traces 68c, bussing lines 68a, and plating contacts 68b. The method includes singulating the embedded chip panel 30 through the saw streets 72 using saw 160. In some aspects of the method, the embedded chip panel 30 may be singulated using saw 160 having a nickel bond blade (shown in FIGS. 4D$_2$ and 4E$_2$) to form a plurality of QFN, DFN, or SON packages with exposed ends 68f of the tie bars 68e exposed at a periphery of the QFN, DFN, or SON packages. After singulation, the tie bars 68e may comprise cut tie bar ends 68f, where the cut tie bar ends 68f may comprise a height in a range of 1-15 micrometers and a width in a range of 1-15 micrometers, and a cross-sectional area in a range of 5-20 micrometers-squared. In some embodiments, after singulation the tie bars 68e may comprise a length less than or equal to 10 micrometers.

Conductive layer 68 also includes contact pads 68b that provide a location for the subsequent formation of vertical conductive elements 140, LGA pads 142 or package I/O interconnects. Contact pads 68b are mechanically and electrically coupled or connected to conductive studs 125 by traces or RDLs 68c. In some instances, metal fill may be disposed around or adjacent traces or RDLs 68c, as shown, e.g., in FIG. 3I. Traces or RDLs, 68c, may be fanned-out over each of the plurality of semiconductor chips (as shown by FIG. 3I) from conductive studs 125 (which are coupled to the plurality of semiconductor chips 14) which are coupled to a stud bonding portion 68i of conductive layer 68, and extending to contact pads 68b. Contact pads 68b can be disposed side-by-side a first distance 68h from package outline 70. Alternatively, contact pads 68b are offset in multiple rows such that a first row of contact pads is disposed the first distance 68h from package outline 70, and a second row of contact pads alternating with the first row is disposed a second distance from the package outline. In some embodiments, the first distance 68h may comprise a distance in a range of 5-100 µm, or 10-50 µm.

Figure 4B:
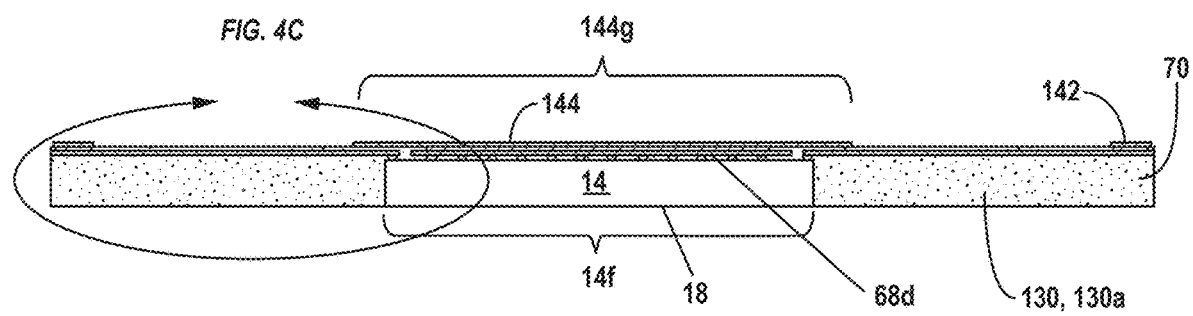
FIG. 4B shows a cross-sectional side view of the QFN, DFN, or SON package shown in FIG. 4A.

A portion of conductive layer 68 is optionally formed as part of a center exposed interior pad, flag or thermal pad 68d. The interior pad 68d may be a ground pad, a power pad (comprising a positive voltage, a thermal pad that is an electrically unconnected structure that is physically present as a thermal pad. The interior pad 68d may be coupled or connected to ground, power, or a thermally transmissive area of (or in) the semiconductor die 14, such as through one or more conductive studs 125 or thermal studs 125a. In an embodiment and as illustrated in FIG. 3K, an interior or ground pad 68d, either alone or with additional conductive material (LGA1) 138 formed as center exposed pad, thermal pad, ground pad 138a, may be exposed at a bottom surface or at a periphery of the completed semiconductor package and may be disposed entirely within a footprint 14f, of semiconductor die 14. Alternatively, interior or ground pad 138a may be disposed partially within a footprint 14f, of semiconductor die 14, and in further embodiments, a footprint 138a of interior or ground pad 138a may extend outside footprint 14f of semiconductor die 14 as shown in the embodiment of FIG. 4B, depicting interior pad, thermal or ground pad 144 having footprint 144g extending beyond footprint 14f, of semiconductor die 14. Thus, conductive layer 68 can be initially formed such that bussing lines 68a, contact pads 68b, RDLs 68c, ground pad 68d, and tie bars 68e are electrically common before the removal of bussing lines 68a, and the cutting of tie bars 68e, such as by singulation. After the removal of bussing lines 68a, and the cutting of tie bars 68e, as shown and described below with respect to FIG. 4A, RDLs or traces 68c are not electrically common and are electrically discrete.

A second encapsulant 130, 130b may be formed over the conductive layer 68 and over the additional conductive layer 138. In some instances, the second encapsulant 130, 130b formed over the conductive layers may be similar or identical to the encapsulant layer or mold compound 130, 130a formed around the semiconductor chips 14. In other instances, the second encapsulant 130, 130b formed over the conductive layer 68 may be a photo-sensitive material (e.g., photosensitive polyimide (PSPI)). In yet other instances, the second encapsulant 130, 130b layer may be patterned and chemically etched.

FIG. 3K depicts an embodiment of a QFN 100, DFN 200, or SON 300 package after singulation from an embedded chip panel 30. Shown are conductive studs 125 formed over a front surface 21 of semiconductor chips 14 and coupled with traces 68, 68c. Further illustrated are thermal studs 125a, which may be formed over a front surface 21 of the plurality of semiconductor chips 14 and coupled with center exposed interior pad, thermal pad, or ground pad 68d to provide thermal dissipation or electrical grounding from the semiconductor chips 14 to the pad 68d and any external devices. In the embodiment of FIG. 3K, the center exposed interior pad, thermal pad, or ground pad 68d may be disposed entirely within a footprint 14f of semiconductor die 14. Further illustrated is first distance 68h from package edge 70. FIG. 3K illustrates like elements as shown and described for FIG. 2. In some instances, the package 100, 20, 300 of FIG. 3K may comprise a backside laminate 50, similar to, or as shown in FIG. 2.

FIG. 4A illustrates a perspective view of a QFN, DEN, or SON package after singulation from the embedded chip panel 30. After singulation, the conductive layer 68 comprises electrically isolated traces 68c and tie bar portions 68e coupled with the traces 68c. Tie bar portions 68e extend from the traces 68c to a package edge 72 where cut tie bar ends 68f are exposed with respect to cut encapsulant 156 at edges 72 of the QFN, DEN, or SON package. A pad surface finish layer or solderable metal system 154 may be electro-plated over one or more of the land pads 142 and over thermal pad, heat sink, or exposed heatsink 144. The land pads 142 comprise a number of side surfaces 142a that are not encapsulant defined and are offset by the first distance 68h from package or singulation edge 72 of the QFN, DFN, or SON package. The side surface 142a may extend around a perimeter of the land pads 142, increasing solder joint strength when the QFN, DFN, or SON package is mounted to a circuit board or other external component. While FIG. 4A illustrates the land pads and center exposed pads protruding a relatively large distance from the upper surface of the encapsulant, the land pads and center exposed pads may be flush or equal in height with the upper surface of the encapsulant, or only slightly offset above or below the upper surface of the encapsulant.

While the QFN, DEN, or SON package comprises exposed copper in the final package with the cut tie bar ends 68f, an amount of exposed conductive material (e.g., copper) will be less than amount of exposed conductive material (e.g., copper) than with a conventional QFN, DFN, or SON package that is built using a leadframe. Creating the tie bar connection 68e allows for a suitable pad finish or bonding material (e.g., tin or a SMS) to be disposed on the LGA or land pad (as well as the center exposed pad) by electrolytic plating, which is less expensive than using immersion plating, which is much more expensive. Additionally, by having a reduced amount of copper being sawn through during singulation (as with respect to a package comprising a conventional leadframe), better sawability and singulation is provided with the current design. The improved sawability and singulation allows for use of a nickel bond blade (a same saw blade as what is used when no copper is present in saw streets), which is an order of magnitude better for the cost of sawing and singulation. Additionally, singulation can occur with a single sawing step, and not use a two-step sawing process, such as when a first larger cut is used to remove copper and form a step, followed by a second cutting that goes through the first cutting to singulate the packages. Forming the package without a step (according to the present design) provides a connection that is better than conventional connections formed with a step. Instead, forming the package without a step (according to the present design) provides improved solderability and a connection that is equal to or better than the connections or solderability of a package formed using a conventional two-step sawing process.

FIG. 4B illustrates cross-sectional side view of the QFN, DFN, or SON package shown above in FIG. 4A. In some embodiments and as depicted in FIG. 4B, the QFN, DFN, or SON package may comprise an interior pad, center exposed interior pad, thermal pad or ground pad 144 having a footprint 144g extending beyond a footprint 14f of the semiconductor chip 14. In some instances, the QFN, DFN, or SON packages, while having many of the same or similar features as in 3K for example, may comprise more than one component or semiconductor chip 14, 14a and 14b, as shown in FIG. 7. This allows for the combination of components or chips 14 having different functionality. Further illustrated in the embodiment of FIG. 4B is where a backside 18 of the semiconductor chip 14 is exposed for thermal management. In addition to the other advantages described above, the present design allows for strip test compatibility, with a reduced isolation cost. For example, isolation and testing may be accomplished as part of process that might comprise one or more of the following features: (i) a laser or a saw may be used to remove a portion of the reconstituted wafer 30 to sever the bussing lines 68a and the tie bars 68e among the various packages to electrically isolate features before electrical testing; (ii) some or more of the reconstituted wafer 30 may be removed so as to separate the reconstituted wafer into separate strips comprising a plurality of QFN, DFN, or SON packages for strip testing; and (iii) at some point, including after strip testing, the separate strips may be singulated into individual QFN, DFN, or SON packages.

In other instances, one or more of more of the following features may be incorporated: (i) remove more of the embedded chip panel to separate the embedded chip panel into separate strips comprising a plurality of QFN, DFN, or SON packages for strip testing; (ii) plate an SMS; (iii) remove with a laser or a saw a portion of the embedded chip panel to sever the bussing lines and the tie bars; and (iv) after strip testing, singulating the strips into individual QFN, DFN, or SON packages.

Figure 4C:
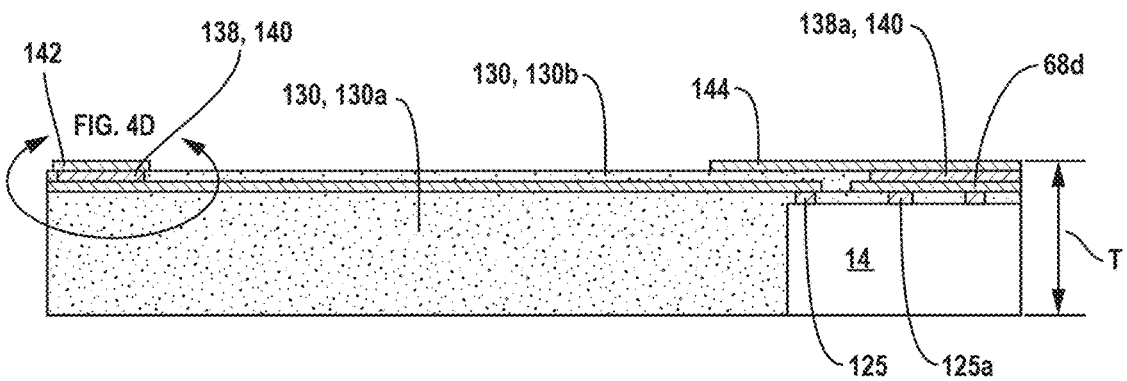
FIG. 4C depicts a cross-sectional side view of a portion of the left side of the QFN, DFN, or SON package shown in FIG. 4B.

FIG. 4C illustrates an enlarged close-up cross-sectional side view of the left side of the QFN, DFN, or SON package shown above in FIG. 4B. FIG. 4C further illustrates that the QFN, DEN, or SON package comprises a total height or thickness (T) less than or equal to 300 micrometers (μm) which is less than a conventional thin QFNs or Ultra-Thin QFN (UQFN) that will be specified as nominally comprising a thickness of 0.55 millimeters (mm) or 550 micrometers (μm). The QFN, DEN, or SON package of FIG. 4C may further comprise a total height T less than or equal to 200 μm, or less than or equal to 100 μm. The process of record (POR) or method for forming the QFN, DFN, or SON may comprise forming or disposing the encapsulant or EMC 130 over or around the conductive studs 125, planarizing the encapsulant 130 and ends 128 of the conductive studs 125, forming or plating-up the conductive layer or RDL 68, form or plate one or more of the vertical conductive elements 140, the land pads or LGA 142, and interior pad(s) 138a as part of additional conductive layer 138, disposing an additional encapsulant layer over the conductive layers or disposing a photosensitive material like photosensitive polyimide (PSPI) over the conductive layers, expose and develop the photosensitive material, and then plate the pad finish (solderable finish or SMS) 154 by providing a current through the bussing lines 68a, plating contact 76, and tie bars 68e.

The QFN, DFN, or SON may then be singulated, as shown and discussed below with respect to FIGS. 4E and 4F. In further embodiments, the QFN, DFN, or SON packages may be formed as System-in-Packages (SiPs) or Multi-Chip-Modules (MCMs) comprising two or more chips in at least one of the QFN, DEN, or SON packages. As shown in FIG. 4C, additional conductive layer or land grid array (LGA1) layer 138 may form vertical conductive element 140 and thermal pad, or ground pad 138a. The vertical conductive element 140 may be a conductive interconnect structure that has generally vertical sides and is typically wider than it is tall, built-up on a substrate, such as over an active surface of a chip, polyimide or mold compound. The vertical conductive element 140, though typically formed of the same materials as a conductive stud 125 would be formed, is different than a conductive stud 125 which typically has a height equal to or greater than its width. The vertical conductive element 140 may be disposed between, and coupled to, conductive layers 68 and 138, while a conductive stud 125 is formed coupled to a semiconductor chip 14. The vertical conductive element 140, though it commonly is formed in a cylindrical shape, may be formed in any polygonal or other shape and size. The vertical conductive element 140 may be formed by electroplating. The generally vertical sides of the vertical conductive element 140 are different from the sides shape that exists for a solder ball or a squished out solder ball that has generally rounded sides, because the generally vertical nature of the vertical conductive element 140 comes from imperfections in being formed in a structure that has been previously developed or etched, such as within openings in a photoresist layer. Developing or etching does not generally perfectly or uniformly remove the photoresist within the openings, and therefore forms imperfect, generally vertical openings for deposition of the vertical conductive element 140. Generally vertical includes perfectly vertical and imperfectly vertical sides. The vertical conductive element 140 is not a wire bond or solder. In some embodiments, thermal pad, or ground pad 138a may comprise one or more ground planes, non electrically conductive fill material which is electrically isolated, or electrically conductive fill material providing electrical benefit as a floating ground plane.

In further instances of the method as disclosed herein, a molding process may be performed to form second encapsulant 130, 130b, over conductive layer 68 and prior to forming additional conductive layer 138, followed by a laser process to form openings for forming the electroplated land pads 142, and land pads 142 as part of additional conductive layer 138, over the conductive layer 68 and contact pads 68b through laser-defined openings in the second encapsulant 130, 130b. In some instances, a PSPI may be used as the second encapsulant 130, 130b layer and may be patterned and chemically developed. In yet other instances, the second encapsulant 130, 130b layer may be etched by a laser. The openings in the second encapsulant 130, 130b may expose portions of the conductive layer 68 having contact pads 68b for electrodeposition of the LGA pads 142 and interior pad 138a.

FIG. 4D$_1$, continuing from FIG. 4C, is an embodiment of a cross-sectional side view of an enlarged portion of FIG. 4C indicated by detail mark 4D. As shown in FIG. 4D$_1$, seed layer 131 may be formed over encapsulant 130, 130a, (such as over planarized encapsulant surface 132a of FIG. 3F) and conductive layer 68, formed comprising the features as disclosed for FIG. 3J, may be formed over seed layer 131. Further shown is forming vertical conductive elements 140 disposed over and coupled with the conductive layer 68.

FIG. 4D$_1$ further illustrates the second encapsulant 130, 130b, or PSPI disposed over the conductive layer 68 and around and contacting vertical conductive elements 140. Land pads or conductive pads 142 with the pad finish or SMS 154 disposed over the land pad 142 may be disposed over the second encapsulant 130, 130b and coupled to vertical conductive elements 140. According to further embodiments, an additional seed layer 131 (not shown) may be disposed over a planarized surface 132b (as shown, e.g., in FIG. 6B) of the second encapsulant 130, 130b. The additional seed layer 131 may be removed, with the exceptions of those portions of the seed layer 131 that are covered by the land pad 142 and SMS 154. In some embodiments, the seed layer 131 may be used as the plating bus for the additional conductive layer 138 and LGA pads 142 and the SMS 154. In additional embodiments, the method as disclosed uses one or more of the plating busses 68a and the tie bars 68e of conductive layer 68 as the plating bus for the conductive layers 138, 140, 142, 154 and subsequent layers. Accordingly, in some instances the seed layer 131 for the LGA pads 142 and the SMS 154 is unnecessary. FIGS. 4D$_1$ and 4D$_2$ further illustrate where the LGA pads 142 are not encapsulant-defined and form a side surface 142a on vertical sides of the LGA pads 142 and the SMS 154.

In FIG. 4D$_2$, the individual QFN, DEN or SON packages may be singulated from each other by a sawing process using saw 160, or other suitable process including laser or scoring. As shown in FIG. 4D$_2$, the singulation edge or package edge 72, comprising cut encapsulant 156 (as shown, e.g., in FIGS. 2, 4A, and 8), may be offset by first distance 68h from both the conductive LGA pad 142 and the SMS 154 for a better cut. FIG. 4D$_2$ further shows singulation through tie bars 68e as part of traces 68c to form exposed, cut tie bar ends 68f, as also depicted in FIG. 4A, among others.

Figure 6A:
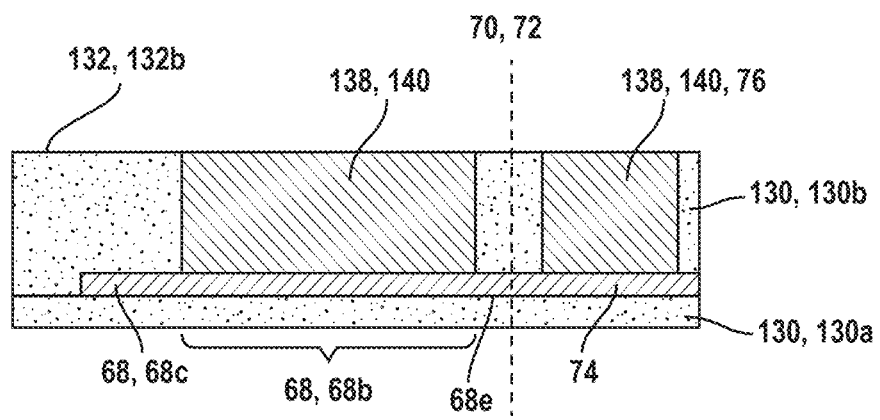
FIGS. 6A and 6B depict cross section views of the conductive layer 68, additional conductive layer 138, and plating contact 76, depicting the formation of LGA pads 142 over contact pads 68b.
Figure 6B:
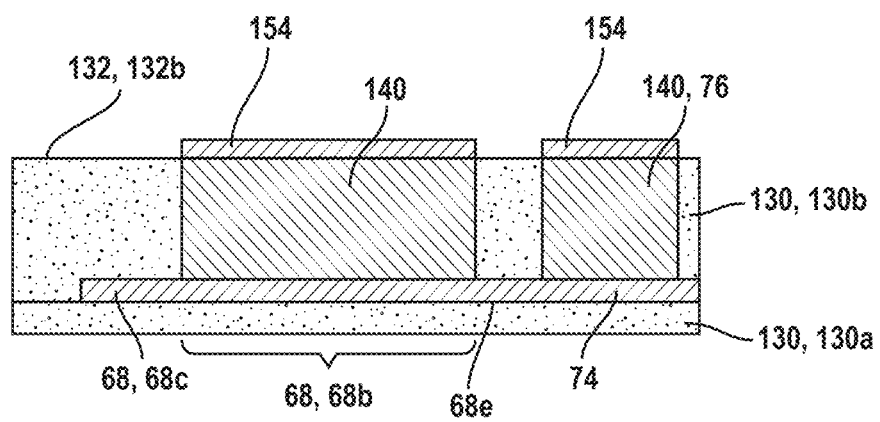

FIG. 4E$_1$ shows an enlargement of a further embodiment of a cross-sectional side view of a portion of FIG. 4C indicated by detail mark 4D. The seed layer 131, conductive layer 68 and second encapsulant 130, 130b may be formed as shown and described for the embodiment of FIG. 4D$_1$. FIG. 4E$_1$ depicts a vertical conductive element 140 having second encapsulant 130, 130b disposed around and contacting vertical conductive element 140 with a pad finish or SMS 154 disposed over the vertical conductive element 140 after conductive element 140 has been exposed from second encapsulant 130, 130b by a planarization or grinding process to form planarized surface 132b (as shown in FIGS. 6A and 6B), without the formation of a separate LGA pad 140 of FIG. 4D$_1$.

FIG. 4E$_2$ illustrates the cross-sectional side view of FIG. 4E$_1$ during a sawing or singulation process to form individual QFN, DEN or SON packages using saw 160, or other suitable process including laser or scoring, as similarly shown and described for FIG. 4D$_2$. The singulation edge or package edge 72, comprising cut encapsulant 156 (as shown, e.g., in FIGS. 2, 4A, and 8), may be offset by first distance 68h from both the conductive LGA pad 142 and the SMS 154 for a better cut. FIG. 4E$_2$ further shows singulation through tie bars 68e as part of traces 68c to form exposed, cut tie bar ends 68f, as also depicted in FIG. 4A, among others.

Figure 4F:
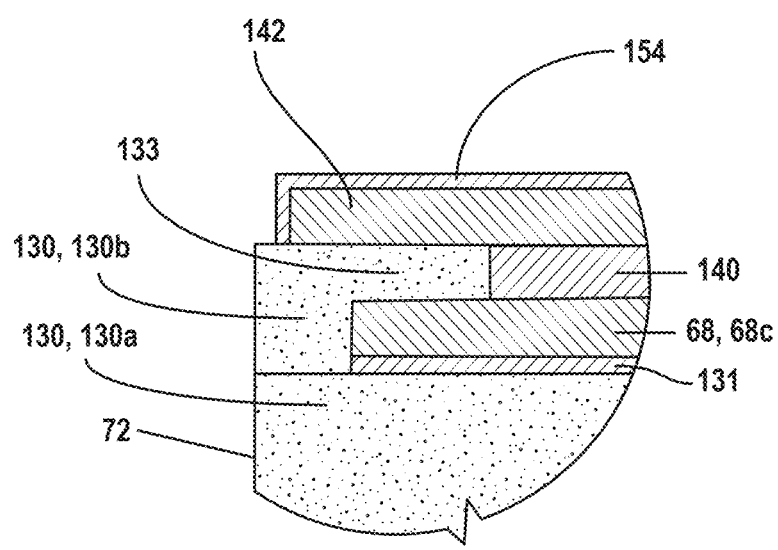
FIG. 4F depicts a cross-sectional side view of a portion of FIG. 4E after singulation, showing a singulation edge and a corner of a conductive pad comprising a solderable metal system formed according to an embodiment of the present disclosure.

FIG. 4F, continuing from FIG. 4E, is a cross-sectional side view of an enlarged portion of a corner of a conductive pad or LGA pad 142, formed according to an embodiment of the present disclosure, comprising the pad surface finish or SMS 154. The pad surface finish or SMS 154 may comprise one or more layers of matte tin, Ni—Pd—Au, Ni—Au, Au, Ag, Ni—Pd, OSP, and solder. As shown by FIG. 4F, additional conductive layers, such as the vertical conductive element 140 may be electroplated within openings formed through the second encapsulant 130, 130b.

FIG. 4F further illustrates a particular embodiment, in which at least one layer of encapsulant 130 comprises a locking feature 133 that is locked between, or interlocked with, two layers of a land pad 142, and for example between the RDL or conductive layer 68, 68c and the conductive pad 142. It should be clear that multiple layers of conductive material, such as internal land pads, vias or traces as well as multiple RDL layers, can be repeated to form the vertical conductive element 140 or the land pad 142 so that multiple layers of encapsulant 130 are interlocked between at least three or even more layers of conductive material. Seed layer 131 is depicted as remaining under conductive layer 68 after an etching process to remove the seed layer.

In other embodiments, more than just two layers of the same kind of encapsulant 130 may be formed, interlocked with layers of the land pad 142 so that the conductive layers, beginning with the conductive layer or traces 68, 68c, and ending with the land pad 142, regardless of how many layers is used, includes interlocking structures 133 extending into the layers of the same kind of encapsulant 130. In some particular embodiments, instead of EMC, thick mold compound (TMC), or other known mold compound may be used. By interlocking the land pad 142 with encapsulant layers 130, particularly of encapsulant layers 130 of the same kind of encapsulant materials, an interlocking structure is formed and the land pads 142 have better adhesion to the encapsulant 130. Furthermore, the disclosed LGA structure as depicted in FIG. 4F resolves the prior art issues of burring at package edges because the land pads 142 do not extend to the edge 72 of the package. In addition, the disclosed LGA structure reduces exposed copper at the package edge, thereby minimizing oxidation and promoting solder wettability.

Figure 5:
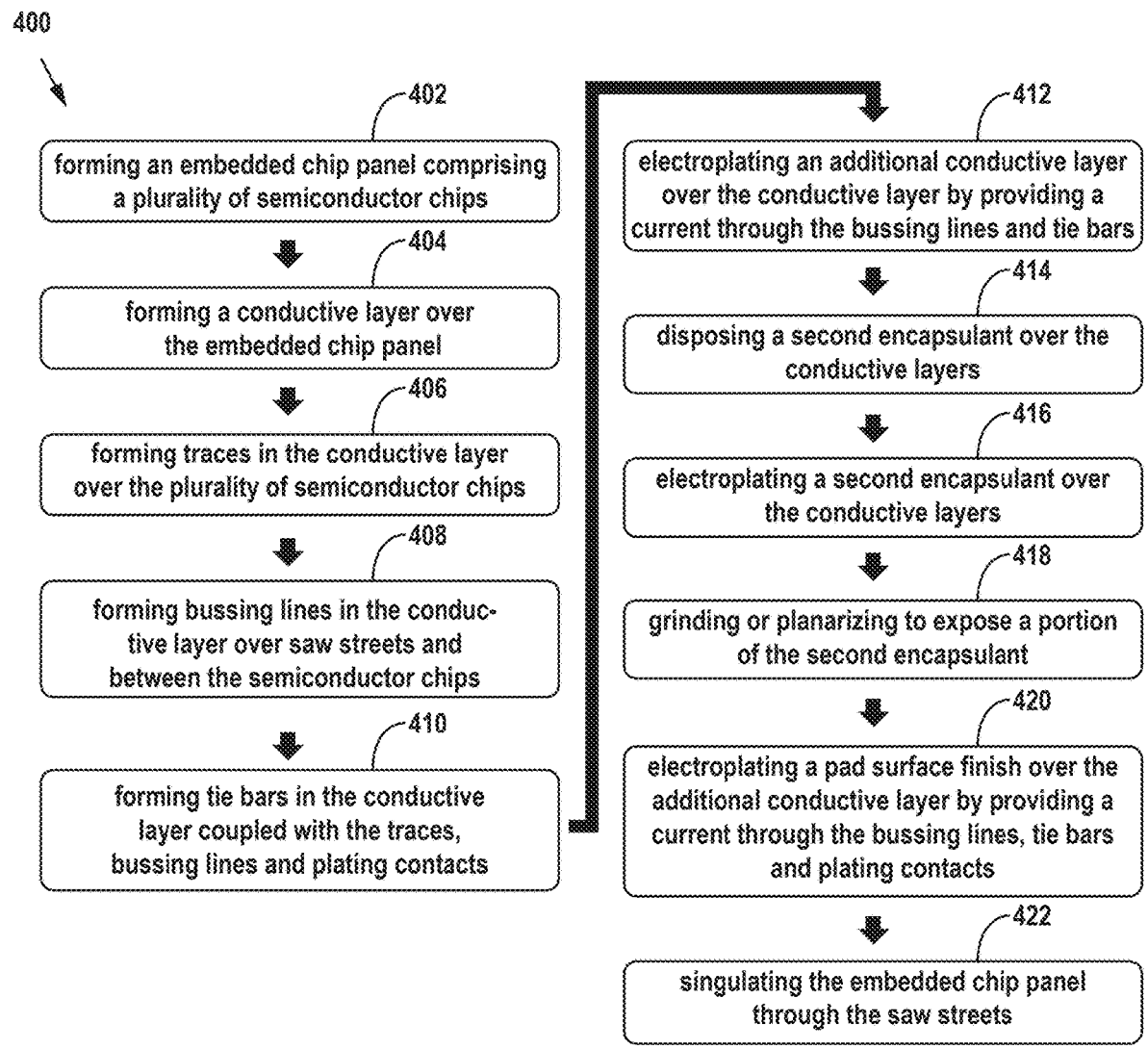
FIG. 5 illustrates a flowchart for an embodiment of the methods of making a quad flat no-lead (QFN), dual flat no-lead (DFN) or small outline no-lead (SON) package as disclosed herein.

FIG. 5 represents a flowchart for a method 400 of making a quad flat no-lead (QFN), dual flat no-lead (DFN) or small outline no-lead (SON) package as disclosed herein. The method 400 of FIG. 5 is supported by a number of the FIGS. included herein. Element 402 discloses forming an embedded chip panel 30 comprising a plurality of semiconductor chips 14 embedded in an encapsulant 130 and separated by saw streets 72. Element 404 discloses forming a conductive layer 68 over the embedded chip panel 30. Element 406 discloses forming traces 68c in the conductive layer 68, the traces 68c formed over the plurality of semiconductor chips 14, the traces 68c extending beyond an edge 24 of the semiconductor chips or component 14, and coupled with conductive studs 125 coupled to the plurality of semiconductor chips 14. Element 408 discloses forming bussing lines 68a as part of the conductive layer 68, over saw streets 72 and between the semiconductor chips 14. Element 410 discloses forming tie bars 68e as part of the conductive layer 68, coupled with the traces 68c, bussing lines 68a and plating contacts 76. Element 412 discloses electroplating an additional conductive layer 138 over the conductive layer 68 by providing a current through the bussing lines 68a and tie bars 68e. Land pads 142 and interior pad 68d and in some embodiments interior pad or thermal pad 144 may be formed as part of element 412. Element 414 represents disposing a second encapsulant 130, 130b over the conductive layer 68 and over and around additional conductive layer 138. At element 416, the second encapsulant 130, 130b is ground or planarized to form a planar surface 132b to expose portions of the conductive layer 68, such as land pads 142, interior pad 68d (and in some embodiments interior pad or thermal pad 144) as well as plating contacts 76. The SMS 154 may be formed according to element 418. Element 420 represents singulation of the QFN, DFN, or SON packages.

FIGS. 6A and 6B depict cross section views of the conductive layer 68, additional conductive layer 138, and plating contact 76, depicting the formation of LGA pads 142 over contact pads 68b. SMS 154 is shown as deposited over the additional conductive layer 138 that is part of planar surface 132b, as shown in FIG. 6B.

FIG. 7 illustrates a QFN, DFN and SON package comprising two semiconductor chips or components 14 according to the embodiments as disclosed herein. Combining two or more semiconductor chips or components 14 provides combined functionality within a single package, according to the semiconductor chip 14 functionality. Conductive layer 68 or additional conductive layer 138 may be patterned to provide electrical coupling between multiple chips or components 14 in this configuration. In some instances, the package 100, 20, 300 of FIG. 7 may comprise a backside laminate 50, similar to, or as shown in FIG. 2.

Figure 8:
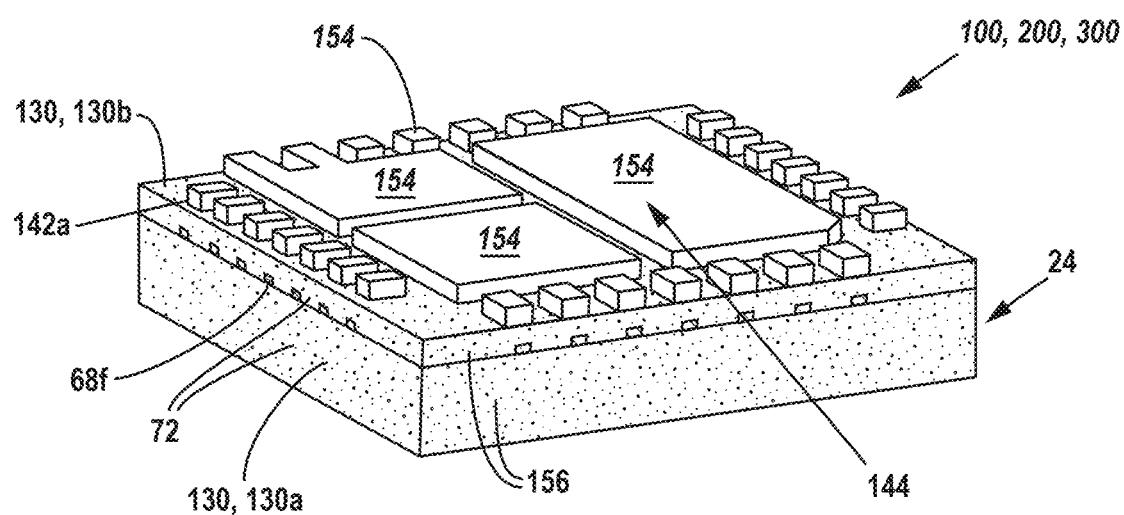
FIG. 8 illustrates QFN, DEN and SON packages comprising two or more thermal pads or ground planes.

FIG. 8 illustrates QFN, DEN and SON packages comprising more than one pad (e.g. a power pad and a ground pad), independent interior pads, thermal pads or ground planes 144, which may be formed over additional conductive layer 138, comprising thermal pad, or ground pad 138a. In some embodiments as shown in FIG. 8, one or more land pads 142 (as shown in FIG. 4A) may be electrically connected to interior pads, thermal pads or ground planes 144. In some embodiments, the QFN, DEN and SON packages 100, 200, 300 may comprise one or more of multiple independent interior pads, land pads formed in single row, multiple-rows, land grid array (LGA), ball grid array (BGA), or as an area array for thermal, power, and signal interconnection.

This disclosure, its aspects and implementations, are not limited to the specific package types, material types, or other system component examples, or methods disclosed herein. Many additional components, manufacturing and assembly procedures known in the art consistent with semiconductor wafer fabrication, manufacture and packaging are contemplated for use with particular implementations from this disclosure. Accordingly, for example, although particular implementations are disclosed, such implementations and implementing components may comprise any components, models, types, materials, versions, quantities, or the like as is known in the art for such systems and implementing components, consistent with the intended operation.

The invention claimed is:

1. A method of making a quad flat no-lead (QFN), dual flat no-lead (DFN) or small outline no-lead (SON) package, the method comprising:
   forming an embedded chip panel comprising a plurality of semiconductor chips embedded in a first encapsulant and separated by saw streets;
   forming a conductive layer over the embedded chip panel, the conductive layer comprising:
      contact pads and traces formed over the plurality of semiconductor chips, the traces extending beyond an edge of the semiconductor chips,
      bussing lines formed over the saw streets, and
      tie bars extending between and coupled with the contact pads and the bussing lines;
   forming vertical conductive elements disposed over and coupled with the conductive layer;
   disposing a second encapsulant over the conductive layer and around the vertical conductive elements such that a plurality of the vertical conductive elements comprise exposed ends, and wherein at least a portion of the tie bars comprise cut tie bar ends exposed at a side surface of the second encapsulant;

electroplating land pads, a conductive pad finish, or a solderable metal system (SMS) over the vertical conductive elements and plating contacts by providing a current through the bussing lines and tie bars, wherein the land pads, conductive pad finish, or SMS are electroplated and protrude from a top surface of the second encapsulant and the plating contacts are coupled to the bussing lines, extend over a reinforcement strip of the conductive layer and are horizontally offset from the plurality of semiconductor chips; and singulating the embedded chip panel through the saw streets to form a plurality of QFN, DFN, or SON packages with the cut tie bar ends being exposed at a periphery of the QFN, DFN, or SON packages.

2. The method of claim 1, wherein forming the embedded chip panel further comprises:

disposing the plurality of semiconductor chips face-up on a temporary carrier, the plurality of semiconductor chips comprising conductive studs disposed over active layers of the plurality of semiconductor chips;

disposing the first encapsulant in a single step around four side surfaces of the plurality of semiconductor chips, over the active layers of the plurality of semiconductor chips, and around at least a portion of sidewalls of the conductive studs, wherein a portion of the first encapsulant disposed between the plurality of semiconductor chips forms the saw streets; and planarizing a surface of the first encapsulant and the conductive studs.

3. The method of claim 1, wherein interior pads are formed over the plurality of semiconductor chips.

4. The method of claim 1, wherein the cut tie bar ends comprise a cross-sectional area in a range of 5-20 micrometers-squared.

5. The method of claim 1, wherein electroplating the land pads, conductive pad finish, or SMS forms a plurality of side surfaces each offset by a first distance from the side surface of the second encapsulant.

6. The method of claim 1, wherein the QFN, DFN, or SON package comprises a total height less than 300 micrometers.

7. The method of claim 1, wherein the QFN, DFN, or SON package comprises one or more of:

multiple independent interior pads; or the land pads formed in single row, multiple rows, or as an area array.

8. The method of claim 1, further comprising forming the conductive layer comprising reinforcement strips formed around a periphery of the embedded chip panel.

9. The method of claim 1, further comprising forming the QFN, DFN, or SON packages as System-in-Packages (SiPs) or Multi-Chip-Modules (MCMs) comprising two or more chips in at least one of the QFN, DFN, or SON packages.

10. The method of claim 1, further comprising forming at least a portion of the conductive layer using unit-specific patterning to account for actual positions of the plurality of semiconductor chips embedded within the embedded chip panel.

11. A method of making a quad flat no-lead (QFN), dual flat no-lead (DFN) or small outline no-lead (SON) package, the method comprising:

forming an embedded chip panel comprising a plurality of semiconductor chips embedded in a first encapsulant and separated by saw streets;

forming a conductive layer over the embedded chip panel, the conductive layer comprising bussing lines, contact pads, traces, and tie bars, wherein the tie bars extend between and are coupled with the contact pads and the bussing lines, and wherein the bussing lines and tie bars extend into the saw streets;

forming vertical conductive elements disposed over and coupled with the conductive layer;

disposing a second encapsulant over the conductive layer and around the vertical conductive elements such that the vertical conductive elements comprise exposed ends, and wherein at least a portion of the tie bars is exposed at a side surface of the second encapsulant; and electroplating land pads, a conductive pad finish, or a solderable metal system (SMS) over the vertical conductive elements and plating contacts by providing a current through the bussing lines and tie bars, wherein the plating contacts are coupled to the bussing lines, extend over a reinforcement strip of the conductive layer and are horizontally offset from the plurality of semiconductor chips.

12. The method of claim 11, further comprising electroplating a pad surface finish over the land pads to form a side surface for the land pads.

13. The method of claim 11, wherein the QFN, DFN, or SON package comprises one or more of multiple independent interior pads, land pads formed in single row, multiple-rows, land grid array (LGA), ball grid array (BGA), or as an area array for thermal, power, signal.

14. The method of claim 11, further comprising singulating the embedded chip panel through the saw streets, comprising:

removing a portion of the embedded chip panel to sever the tie bars; and singulating the embedded chip panel into individual QFN, DFN, or SON packages.

15. The method of claim 11, further comprising forming the QFN, DFN, or SON packages as System-in-Packages (SiPs) or Multi-Chip-Modules (MCMs) comprising two or more chips in at least one of the QFN, DFN, or SON packages.

16. The method of claim 11, further comprising forming at least a portion of the conductive layer using unit-specific patterning to account for actual positions of the plurality of semiconductor chips embedded within the embedded chip panel.

17. A method of making a quad flat no-lead (QFN), dual flat no-lead (DFN) or small outline no-lead (SON) package, the method comprising:

forming an embedded chip panel comprising a plurality of semiconductor chips embedded in a first encapsulant and separated by saw streets;

forming a conductive layer over the embedded chip panel and extending into a saw street of the saw streets separating the semiconductor chips;

electroplating a vertical conductive element over the conductive layer by providing a current through the conductive layer;

disposing a second encapsulant over the conductive layer, wherein at least a portion of the conductive layer is exposed at a side surface of the second encapsulant; and electroplating land pads, a conductive pad finish, or a solderable metal system (SMS) over the vertical conductive element and a plating contact by providing a current through the conductive layer, wherein the plating contact is coupled to bussing lines of the conductive layer, extends over a reinforcement strip of the conductive layer and is horizontally offset from the plurality of semiconductor chips.

18. The method of claim 17, further comprising an electroplated interior pad disposed over the embedded chip panel.

19. The method of claim 17, wherein:
the embedded chip panel comprises conductive studs coupled to an active layer of the embedded chip panel; and
the first encapsulant is over the active layer of the embedded chip panel and contacts a side surface of the conductive studs.

20. The method of claim 17, further comprising a pad surface finish over the land pads to form a side surface for the land pads that is not encapsulant defined.

21. The method of claim 17, wherein the QFN, DFN, or SON package comprises one or more of multiple independent interior pads, land pads formed in single row, multiple-rows, land grid array (LGA), ball grid array (BGA), or as an area array for thermal, power, signal.

22. The method of claim 17, further comprising forming the QFN, DFN, or SON packages as System-in-Packages (SiPs) or Multi-Chip-Modules (MCMs) comprising two or more embedded components in the QFN, DFN, or SON packages.

23. The method of claim 17, further comprising unit-specific patterning that results with a misalignment between the embedded chip panel and the conductive layer that is less than a misalignment between the embedded chip panel and a package edge.

\* \* \* \* \*